(12) United States Patent
Pappas

(10) Patent No.: US 10,902,769 B2
(45) Date of Patent: Jan. 26, 2021

(54) MULTI-LAYER FABRICATION FOR PIXELS WITH CALIBRATION COMPENSATION

(71) Applicant: Facebook Technologies, LLC, Menlo Park, CA (US)

(72) Inventor: Ilias Pappas, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 258 days.

(21) Appl. No.: 16/020,815

(22) Filed: Jun. 27, 2018

(65) Prior Publication Data

US 2019/0019449 A1     Jan. 17, 2019

Related U.S. Application Data

(60) Provisional application No. 62/531,830, filed on Jul. 12, 2017.

(51) Int. Cl.
    *G09G 3/32*     (2016.01)
    *H01L 25/16*     (2006.01)
    (Continued)

(52) U.S. Cl.
    CPC ............ *G09G 3/32* (2013.01); *H01L 25/167* (2013.01); *G02B 26/0833* (2013.01);
    (Continued)

(58) Field of Classification Search
    CPC ..... G09G 3/32; H01L 25/167; H01L 25/0753; G02B 26/0833; G02B 26/101; G02B 27/0172; G02B 27/0178
    See application file for complete search history.

(56) References Cited

U.S. PATENT DOCUMENTS

| 7,119,801 B1 | 10/2006 | Endo et al. |
|---|---|---|
| 8,399,982 B2 | 3/2013 | Wyland |

(Continued)

FOREIGN PATENT DOCUMENTS

| EP | 2472577 A2 | 7/2012 |
|---|---|---|
| WO | WO 2010/027962 A2 | 3/2010 |
| WO | WO 2016/200882 A1 | 12/2016 |

OTHER PUBLICATIONS

PCT International Search Report and Written Opinion, PCT Application No. PCT/US2018/041429, dated Dec. 7, 2018, 18 pages.

(Continued)

*Primary Examiner* — Antonio Xavier
(74) *Attorney, Agent, or Firm* — Fenwick & West LLP

(57) ABSTRACT

An electronic display includes a multi-layer structure that reduces form factor and provides optimization of the electronic display on a per layer basis. The electronic display includes a driver layer, a control layer, and an interposer layer between the driver layer and the control layer. The driver layer includes one or more drivers to provide control signals. The control layer includes control circuits configured to drive light emitting diodes (LEDs) under control of the control signals from the driver layer. The interposer layer is between the driver layer and the control layer. The interposer layer includes electrical connections between the one or more drivers of the driver layer and the control circuits of the control layer to transmit the control signals from the driver layer to the control layer.

18 Claims, 20 Drawing Sheets

(51) Int. Cl.
*G02B 27/01* (2006.01)
*G02B 26/08* (2006.01)
*G02B 26/10* (2006.01)
*H01L 25/075* (2006.01)

(52) U.S. Cl.
CPC ........ *G02B 26/101* (2013.01); *G02B 27/0172* (2013.01); *G02B 2027/0178* (2013.01); *H01L 25/0753* (2013.01)

(56) References Cited

U.S. PATENT DOCUMENTS

| | | | |
|---|---|---|---|
| 8,536,714 | B2 | 9/2013 | Sakaguchi |
| 9,165,877 | B2 | 10/2015 | Chen et al. |
| 9,799,622 | B2 | 10/2017 | Hu |
| 9,829,710 | B1* | 11/2017 | Newell ............. G02B 27/0176 |
| 2002/0011657 | A1 | 1/2002 | Saito |
| 2006/0071344 | A1 | 4/2006 | Nihei |
| 2010/0294547 | A1 | 11/2010 | Hatanaka et al. |
| 2012/0168206 | A1 | 7/2012 | Sekine et al. |
| 2012/0327129 | A1* | 12/2012 | Li ........................ G09G 3/3216 345/690 |
| 2013/0082984 | A1 | 4/2013 | Drzaic et al. |
| 2013/0242056 | A1* | 9/2013 | Fleck ................ G02B 27/0093 348/47 |
| 2014/0231126 | A1 | 8/2014 | Hunrath et al. |
| 2015/0022561 | A1* | 1/2015 | Ikeda ..................... G09F 9/301 345/690 |
| 2015/0108657 | A1 | 4/2015 | Kim |
| 2015/0261057 | A1 | 9/2015 | Harris et al. |
| 2016/0098959 | A1* | 4/2016 | Moon ................. G09G 3/3696 345/205 |
| 2016/0218046 | A1* | 7/2016 | Or-Bach ............ H03K 19/1774 |
| 2017/0040306 | A1 | 2/2017 | Kim et al. |
| 2017/0167703 | A1 | 6/2017 | Cok |
| 2017/0263204 | A1* | 9/2017 | Tanaka ................. G09G 3/3677 |
| 2018/0102085 | A1* | 4/2018 | Pan ...................... G09G 3/3291 |
| 2018/0254226 | A1* | 9/2018 | Iguchi ................. H01L 25/0753 |
| 2019/0011652 | A1* | 1/2019 | Chang ................. H05K 1/0274 |

OTHER PUBLICATIONS

Extended European Search Report, European Application No. 18190462.4, dated Nov. 28, 2018, 10 pages.

Huang, Z. et al., "Metal-Assisted Chemical Etching of Silicon: A Review," Advanced Materials, 2011, pp. 285-308, vol. 23.

Lee, K.W. et al., "Novel W2W/C2W Hybrid Bonding Technology with High Stacking Yield Using Ultra-Fine Size, Ultra-High Density Cu Nano-Pillar (CNP) for Exascale 2.5/3D Integration," 2016 IEEE 66th Electronic Components and Technology Conference, IEEE, pp. 350-355.

Lu, C. et al., "Anodic Aluminium Oxide-based Nanostructures and Devices," Encyclopedia of Nanoscience and Nanotechnology, 2011, pp. 235-259, vol. 11.

PCT International Search Report and Written Opinion, PCT Application No. PCT/US2018/045047, dated Nov. 28, 2018, 17 pages.

* cited by examiner

600

```
┌─────────────────────────────────────────────────────────┐
│   Set PWM signal to a low level to turn off transistor 506  │
│                            605                              │
└─────────────────────────────────────────────────────────┘
                            ↓
┌─────────────────────────────────────────────────────────┐
│  Set scan signal$_N$ to a high level for gates of transistors 504 and │
│  510 and data signal to Vdata for source of transistor 504, causing │
│     capacitor 512 to charge up to Vdata and node A being Vdata      │
│                            610                              │
└─────────────────────────────────────────────────────────┘
                            ↓
┌─────────────────────────────────────────────────────────┐
│   Set scan signal$_N$ to a low level for gate of transistor 508, causing │
│        the capacitor 512 to turn into a floating capacitor      │
│                            615                              │
└─────────────────────────────────────────────────────────┘
                            ↓
┌─────────────────────────────────────────────────────────┐
│  Set scan signal$_{N+1}$ to a high level for gate of the transistor 506 │
│               causing the transistor 506 to turn on         │
│                            620                              │
└─────────────────────────────────────────────────────────┘
                            ↓
┌─────────────────────────────────────────────────────────┐
│  Set calibration signal to Vcal for the drain of the transistor 506 to │
│   apply Vcal to the node B, resulting in node A and gate of transistor │
│               506 being increased to Vdata + Vcal           │
│                            625                              │
└─────────────────────────────────────────────────────────┘
                            ↓
┌─────────────────────────────────────────────────────────┐
│  Set the PWM signal to a high level, resulting in LED 502 emitting │
│   according to the PWM signal when the transistor 506 is turned on │
│         by Vdata + Vcal at the gate of the transistor 506   │
│                            630                              │
└─────────────────────────────────────────────────────────┘
```

FIG. 6

MULTI-LAYER FABRICATION FOR PIXELS WITH CALIBRATION COMPENSATION

CROSS REFERENCE TO RELATED APPLICATION

This application claims the benefit under 35 U.S.C. § 119(e) to U.S. Provisional Patent Application No. 62/531,830, titled "Multi-Layer Fabrication for Pixels with Calibration Compensation," filed Jul. 12, 2017, which is incorporated by reference in its entirety.

BACKGROUND

The present disclosure generally relates to fabrication of electronic displays.

Electronic displays can include digital components and analog components that operate using different voltage levels. For example, displays may use a planar architecture where light sources, backplane electronics, and driving circuitry are positioned on the same substrate. A planar architecture can result in a large form factor, which can be undesirable in head-mounted displays, mobile devices, etc. Furthermore, placing the different components of the electronic display on different chips can result in performance degradation, such as may be caused by signal delays and synchronization issues between the chips.

SUMMARY

Embodiments relate to providing an electronic display having a multi-layer architecture. The electronic display includes a driver layer, a control layer, and an interposer layer between the driver layer and the control layer. The driver layer includes one or more drivers to provide control signals. The control layer includes control circuits to drive light emitting diodes (LEDs) under control of the control signals from the driver layer. The interposer layer includes including electrical connections between the one or more drivers of the driver layer and the control circuits of the control layer to transmit the control signals from the driver layer to the control layer.

In some embodiments, the electronic display includes an LED layer including the LEDs, and a metal layer between the control layer and the LED layer. The control layer generates driving currents according to the control signals from the driver layer to drive the LEDs. The metal layer includes electrical connections between the control circuits of the control layer and the LEDs of the LED layer to transmit the driving currents from the control layer to the LED layer.

Some embodiments include a method for controlling an electronic display. The method includes: generating, by a driver layer including one or more drivers, control signals; transmitting, by an interposer layer between the driver layer and a control layer, the control signals from the driver layer to the control layer; and driving, by the control layer, light emitting diodes (LEDs) of the electronic display under control of the control signals from the driver layer.

Some embodiments include an electronic display, including: a driver layer including one or more drivers configured to provide control signals; a first control layer; a first interposer layer between the driver layer and the first control layer, the first interposer layer including electrical connections between the one or more drivers of the driver layer and first control layer to transmit the control signals from the driver layer to the first control layer; a second control layer including control circuits configured to drive light emitting diodes (LEDs) according to the control signals from the driver layer; and a second interposer layer between the first control layer and the second control layer, the second interposer layer including electrical connections between the first control layer and the control circuits of the second control layer to transmit the control signals from the first control layer to the second control layer.

Some embodiments include a head-mounted display (HMD) including the electronic display. Other aspects include components, devices, systems, improvements, methods, processes, applications, computer readable mediums, and other technologies related to any of the above.

BRIEF DESCRIPTION OF THE DRAWINGS

FIG. 6 is a flow chart of a process for controlling a sub-pixel of the electronic display, in accordance with one embodiment.

The figures depict embodiments of the present disclosure for purposes of illustration only.

DETAILED DESCRIPTION

Embodiments relate to an electronic display including a multi-layer structure. The multi-layer structure can provide a reduced form factor for the electronic display that is desirable in electronic devices, such as head-mounted displays. The multi-layer structure can also provide for optimization of the electronic display on a per layer basis, thus improving system performance. For example, the multi-layer structure may include a driver layer that provides control signals for the electronic display, a control layer to drive light emitting diodes (LEDs) under control of the control signals from the driver layer, an interposer layer between the driver layer and the control layer, a metal layer on the control layer to connect the control layer to the LEDs, and an LED layer including the LEDs on the metal layer.

Each layer may be optimized differently according to best performance and best form factor. For example, the driver layer may include a smaller minimum feature size than the control layer, or may operate at a higher frequency than the control layer. Different layers may be fabricated using different fabrication processes, and then joined using an interposer layer.

Figure 1:
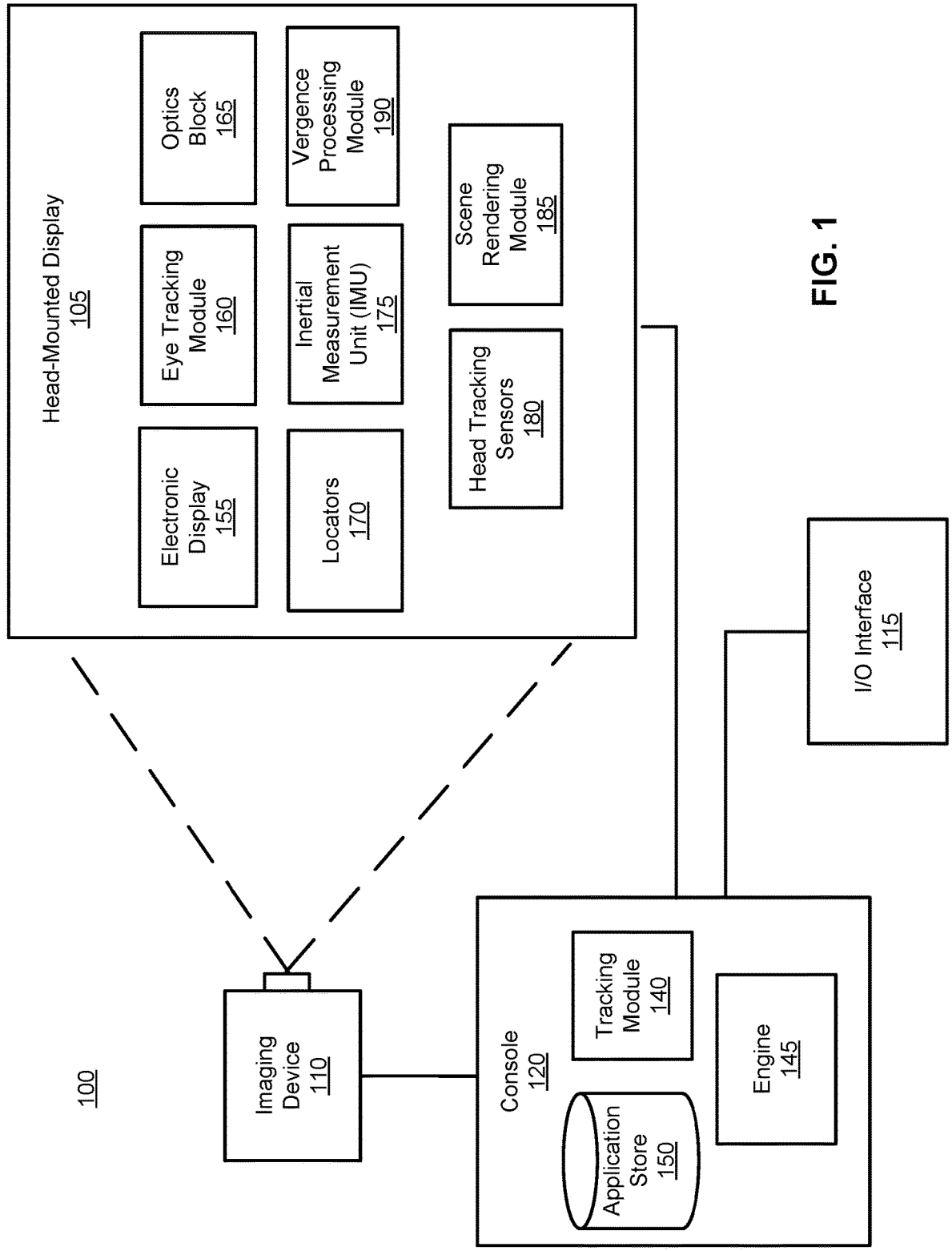
FIG. 1 is a block diagram illustrating a system associated with a head-mounted display (HMD), in accordance with one embodiment.

FIG. 1 shows a system 100 including a head-mounted display (HMD). The system 100 may be for use as a virtual reality (VR) system, an augmented reality (AR) system, a mixed reality (MR) system, or some combination thereof. In this example, the system 100 includes a HMD 105, an imaging device 110, and an input/output (I/O) interface 115, which are each coupled to a console 120. While FIG. 1 shows a single HMD 105, a single imaging device 110, and an I/O interface 115, in other embodiments, any number of these components may be included in the system. For example, there may be multiple HMDs 105 each having an associated input interface 115 and being monitored by one or more imaging devices 110, with each HMD 105, I/O interface 115, and imaging devices 110 communicating with the console 120. In alternative configurations, different and/or additional components may also be included in the system 100. The HMD 105 may act as a VR, AR, and/or a MR HMD. An MR and/or AR HMD augments views of a physical, real-world environment with computer-generated elements (e.g., images, video, sound, etc.).

The HMD 105 presents content to a user. Example content includes images, video, audio, or some combination thereof. Audio content may be presented via a separate device (e.g., speakers and/or headphones) external to the HMD 105 that receives audio information from the HMD 105, the console 120, or both. The HMD 105 includes an electronic display 155, an eye tracking module 160, an optics block 165, one or more locators 170, an internal measurement unit (IMU) 175, head tracking sensors 180, and a scene rendering module 185, and a vergence processing module 190.

The electronic display 155 has a multi-row active matrix architecture that delivers pulse-width modulation (PWM), data loading, and calibration independently to each other. In some embodiments, the electronic display 155 provides a display of gaze contingent content concurrent with eye position detection. The detection of eye tracking information is used as an input to generate (e.g., a subsequent video frame) of gaze contingent content.

The optics block 165 adjusts its focal length responsive to instructions from the console 120. In some embodiments, the optics block 165 includes a multi multifocal block to adjust a focal length (adjusts optical power) of the optics block 165.

The eye tracking module 160 tracks an eye position and eye movement of a user of the HMD 105. The light detectors of the electronic display 155 (e.g., or elsewhere in the HMD 105) capture image information of a user's eyes, and the eye tracking module 160 uses the captured information to determine eye tracking information such as the focus area and non-focus area(s) of the user's eyes on a display panel, interpupillary distance, interocular distance, a three-dimensional (3D) position of each eye relative to the HMD 105 (e.g., for distortion adjustment purposes), including a magnitude of torsion and rotation (i.e., roll, pitch, and yaw) and gaze directions for each eye. The information for the position and orientation of the user's eyes is used to determine the gaze point in a virtual scene presented by the HMD 105 where the user is looking.

The vergence processing module 190 determines a vergence depth of a user's gaze based on the gaze point or an estimated intersection of the gaze lines determined by the eye tracking module 160. Vergence is the simultaneous movement or rotation of both eyes in opposite directions to maintain single binocular vision, which is naturally and automatically performed by the human eye. Thus, a location where a user's eyes are verged is where the user is looking and is also typically the location where the user's eyes are focused. For example, the vergence processing module 190 triangulates the gaze lines to estimate a distance or depth from the user associated with intersection of the gaze lines. The depth associated with intersection of the gaze lines can then be used as an approximation for the accommodation distance, which identifies a distance from the user where the user's eyes are directed. Thus, the vergence distance allows determination of a location where the user's eyes should be focused.

The locators 170 are objects located in specific positions on the HMD 105 relative to one another and relative to a specific reference point on the HMD 105. A locator 170 may be a light emitting diode (LED), a corner cube reflector, a reflective marker, a type of light source that contrasts with an environment in which the HMD 805 operates, or some combination thereof. Active locators 170 (i.e., an LED or other type of light emitting device) may emit light in the visible band (~380 nm to 850 nm), in the infrared (IR) band (~850 nm to 1 mm), in the ultraviolet band (10 nm to 380 nm), some other portion of the electromagnetic spectrum, or some combination thereof.

The locators 170 can be located beneath an outer surface of the HMD 105, which is transparent to the wavelengths of light emitted or reflected by the locators 170 or is thin enough not to substantially attenuate the wavelengths of light emitted or reflected by the locators 170. Further, the outer surface or other portions of the HMD 105 can be opaque in the visible band of wavelengths of light. Thus, the locators 170 may emit light in the IR band while under an outer surface of the HMD 105 that is transparent in the IR band but opaque in the visible band.

The IMU 175 is an electronic device that generates fast calibration data based on measurement signals received from one or more of the head tracking sensors 180, which generate one or more measurement signals in response to motion of HMD 105. Examples of the head tracking sensors 180 include accelerometers, gyroscopes, magnetometers, other sensors suitable for detecting motion, correcting error associated with the IMU 175, or some combination thereof. The head tracking sensors 180 may be located external to the IMU 175, internal to the IMU 175, or some combination thereof.

Based on the measurement signals from the head tracking sensors 180, the IMU 175 generates fast calibration data indicating an estimated position of the HMD 105 relative to an initial position of the HMD 105. For example, the head tracking sensors 180 include multiple accelerometers to measure translational motion (forward/back, up/down, left/right) and multiple gyroscopes to measure rotational motion (e.g., pitch, yaw, and roll). The IMU 175 can, for example, rapidly sample the measurement signals and calculate the estimated position of the HMD 105 from the sampled data. For example, the IMU 175 integrates measurement signals received from the accelerometers over time to estimate a velocity vector and integrates the velocity vector over time to determine an estimated position of a reference point on the HMD 105. The reference point is a point that may be used to describe the position of the HMD 105. While the reference point may generally be defined as a point in space, in various embodiments, a reference point is defined as a point within the HMD 105 (e.g., a center of the IMU 175). Alternatively, the IMU 175 provides the sampled measurement signals to the console 120, which determines the fast calibration data.

The IMU 175 can additionally receive one or more calibration parameters from the console 120. As further discussed below, the one or more calibration parameters are used to maintain tracking of the HMD 105. Based on a received calibration parameter, the IMU 175 may adjust one or more of the IMU parameters (e.g., sample rate). In some embodiments, certain calibration parameters cause the IMU 175 to update an initial position of the reference point to correspond to a next calibrated position of the reference point. Updating the initial position of the reference point as the next calibrated position of the reference point helps reduce accumulated error associated with determining the estimated position. The accumulated error, also referred to as drift error, causes the estimated position of the reference point to "drift" away from the actual position of the reference point over time.

The scene rendering module 185 receives content for the virtual scene from an engine 145 and provides the content for display on the electronic display 155. Additionally, the scene rendering module 185 can adjust the content based on information from the IMU 175, the vergence processing module 830, and the head tracking sensors 180. The scene rendering module 185 determines a portion of the content to be displayed on the electronic display 155 based on one or more of the tracking module 140, the head tracking sensors 180, or the IMU 175.

The imaging device 110 generates slow calibration data in accordance with calibration parameters received from the console 120. Slow calibration data includes one or more images showing observed positions of the locators 170 that are detectable by imaging device 110. The imaging device 110 may include one or more cameras, one or more video cameras, other devices capable of capturing images including one or more locators 170, or some combination thereof. Additionally, the imaging device 110 may include one or more filters (e.g., for increasing signal to noise ratio). The imaging device 110 is configured to detect light emitted or reflected from the locators 170 in a field of view of the imaging device 110. In embodiments where the locators 170 include passive elements (e.g., a retroreflector), the imaging device 110 may include a light source that illuminates some or all of the locators 170, which retro-reflect the light towards the light source in the imaging device 110. Slow calibration data is communicated from the imaging device 110 to the console 120, and the imaging device 110 receives one or more calibration parameters from the console 120 to adjust one or more imaging parameters (e.g., focal length, focus, frame rate, ISO, sensor temperature, shutter speed, aperture, etc.).

The I/O interface 115 is a device that allows a user to send action requests to the console 120. An action request is a request to perform a particular action. For example, an action request may be to start or end an application or to perform a particular action within the application. The I/O interface 115 may include one or more input devices. Example input devices include a keyboard, a mouse, a hand-held controller, a glove controller, or any other suitable device for receiving action requests and communicating the received action requests to the console 120. An action request received by the I/O interface 115 is communicated to the console 120, which performs an action corresponding to the action request. In some embodiments, the I/O interface 115 may provide haptic feedback to the user in accordance with instructions received from the console 120. For example, haptic feedback is provided by the I/O interface 115 when an action request is received, or the console 120 communicates instructions to the I/O interface 115 causing the I/O interface 115 to generate haptic feedback when the console 120 performs an action.

The console 120 provides content to the HMD 105 for presentation to the user in accordance with information received from the imaging device 110, the HMD 105, or the I/O interface 115. The console 120 includes an application store 150, a tracking module 140, and the engine 145. Some embodiments of the console 120 have different or additional modules than those described in conjunction with FIG. 1. Similarly, the functions further described below may be distributed among components of the console 120 in a different manner than is described here.

The application store 150 stores one or more applications for execution by the console 120. An application is a group of instructions, that when executed by a processor, generates content for presentation to the user. Content generated by an application may be in response to inputs received from the user via movement of the HMD 105 or the I/O interface 115. Examples of applications include gaming applications, conferencing applications, video playback application, or other suitable applications.

The tracking module 140 calibrates the system 100 using one or more calibration parameters and may adjust one or more calibration parameters to reduce error in determining position of the HMD 105. For example, the tracking module 140 adjusts the focus of the imaging device 110 to obtain a more accurate position for observed locators 170 on the HMD 105. Moreover, calibration performed by the tracking module 140 also accounts for information received from the IMU 175. Additionally, if tracking of the HMD 105 is lost (e.g., imaging device 110 loses line of sight of at least a threshold number of locators 170), the tracking module 140 re-calibrates some or all of the system 100 components.

Additionally, the tracking module 140 tracks the movement of the HMD 105 using slow calibration information from the imaging device 110 and determines positions of a reference point on the HMD 105 using observed locators from the slow calibration information and a model of the HMD 105. The tracking module 140 also determines positions of the reference point on the HMD 105 using position information from the fast calibration information from the IMU 175 on the HMD 105. Additionally, the tracking module 160 may use portions of the fast calibration information, the slow calibration information, or some combination thereof, to predict a future location of the HMD 105, which is provided to the engine 145.

The engine 145 executes applications within the system 100 and receives position information, acceleration information, velocity information, predicted future positions, or some combination thereof for the HMD 105 from the tracking module 140. Based on the received information, the engine 145 determines content to provide to the HMD 105 for presentation to the user, such as a virtual scene, one or more virtual objects to overlay onto a real world scene, etc.

In some embodiments, the engine 145 maintains focal capability information of the optics block 165. Focal capability information is information that describes what focal distances are available to the optics block 165. Focal capability information may include, e.g., a range of focus the optics block 165 is able to accommodate (e.g., 0 to 4 diopters), a resolution of focus (e.g., 0.25 diopters), a number of focal planes, combinations of settings for switchable half wave plates (SHWPs) (e.g., active or non-active) that map to particular focal planes, combinations of settings for SHWPS and active liquid crystal lenses that map to particular focal planes, or some combination thereof.

The engine 145 generates instructions for the optics block 165, the instructions causing the optics block 165 to adjust its focal distance to a particular location. The engine 145 generates the instructions based on focal capability information and, e.g., information from the vergence processing module 190, the IMU 175, and the head tracking sensors 180. The engine 145 uses the information from the vergence processing module 190, the IMU 175, and the head tracking sensors 180, or some combination thereof, to select an ideal focal plane to present content to the user. The engine 145 then uses the focal capability information to select a focal plane that is closest to the ideal focal plane. The engine 145 uses the focal information to determine settings for one or more SHWPs, one or more active liquid crystal lenses, or some combination thereof, within the optics block 165 that are associated with the selected focal plane. The engine 145 generates instructions based on the determined settings, and provides the instructions to the optics block 165.

The engine 145 performs an action within an application executing on the console 120 in response to an action request received from the I/O interface 115 and provides feedback to the user that the action was performed. The provided feedback may be visual or audible feedback via the HMD 105 or haptic feedback via the I/O interface 115.

Figure 2:
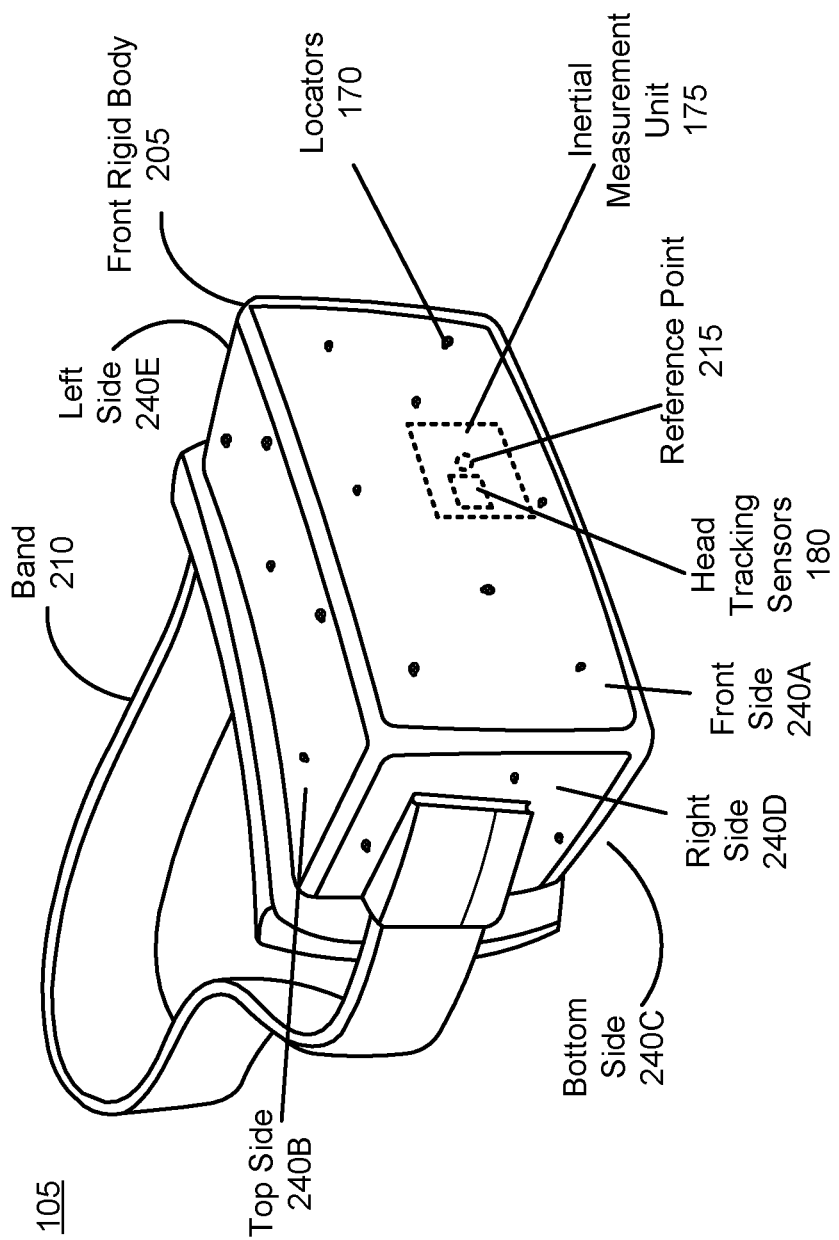
FIG. 2 is a perspective view of the HMD of FIG. 1, in accordance with one embodiment.

FIG. 2 shows a head-mounted display (HMD) 105, in accordance with some embodiments. The HMD 105 includes a front rigid body 205 and a band 210. The front rigid body 205 includes an electronic display (not shown), an inertial measurement unit (IMU) 175, one or more head tracking sensors 180, and locators 170. In some embodiments, a user movement is detected by use of the inertial measurement unit 175, head tracking sensors 180, and/or the locators 170, and an image is presented to a user through the electronic display according to the user movement detected. In some embodiments, the HMD 105 can be used for presenting a virtual reality, an augmented reality, or a mixed reality to a user.

A head tracking sensor 180 generates one or more measurement signals in response to motion of the HMD 105. Examples of head tracking sensors 180 include: one or more accelerometers, one or more gyroscopes, one or more magnetometers, another suitable type of sensor that detects motion, a type of sensor used for error correction of the IMU 175, or some combination thereof. The head tracking sensors 180 may be located external to the IMU 175, internal to the IMU 175, or some combination thereof. In FIG. 2, the head tracking sensors 180 are located within the IMU 175, and neither the IMU 175 nor the head tracking sensors 180 are visible to the user.

Based on the one or more measurement signals from one or more head tracking sensors 180, the IMU 175 generates calibration data indicating an estimated position of the HMD 105 relative to an initial position of the HMD 105. In some embodiments, the IMU 175 rapidly samples the measurement signals and calculates the estimated position of the HMD 105 from the sampled data. For example, the IMU 175 integrates the measurement signals received from the accelerometers over time to estimate a velocity vector and integrates the velocity vector over time to determine an estimated position of a reference point on the HMD 105. Alternatively, the IMU 17 provides the sampled measurement signals to a console (e.g., a computer), which determines the calibration data. The reference point is a point that may be used to describe the position of the HMD 105. While the reference point may generally be defined as a point in space; however, in practice the reference point is defined as a point within the HMD 105 (e.g., a center of the IMU 175).

The locators 170 are located in fixed positions on the front rigid body 205 relative to one another and relative to a reference point 215. In FIG. 2, the reference point 215 is located at the center of the IMU 175. Each of the locators 170 emits light that is detectable by an imaging device (e.g., camera or an image sensor). Locators 170, or portions of locators 170, are located on a front side 240A, a top side 240B, a bottom side 240C, a right side 240D, and a left side 240E of the front rigid body 205 in the example of FIG. 2.

Figure 3:
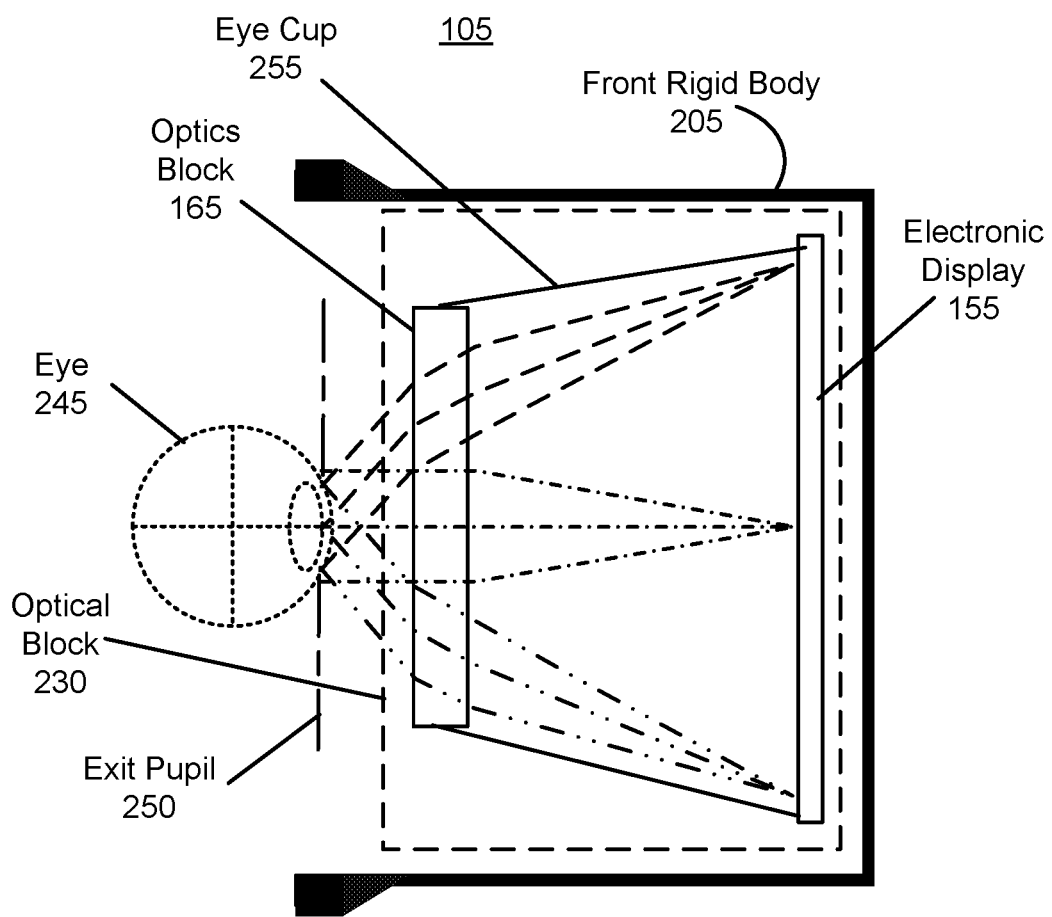
FIG. 3 is a cross sectional diagram illustrating a front rigid body of the HMD in FIG. 2, in accordance with one embodiment.

FIG. 3 shows a cross section of the front rigid body 205 of the HMD 105 shown in FIG. 2. The front rigid body 205 includes the electronic display 155 and an optical block 230. The optical block 230 provides altered image light from the electronic display 155 to an exit pupil 250. The exit pupil 250 is the location in the front rigid body 205 where a user's eye 245 is positioned. Although a single optical block 230 is shown in FIG. 3, the front rigid body 205 may include two optics blocks, one for each eye of the user.

The optical block 230 includes an optics block 165 and an eye cup 255. The eye cup 255 is mechanically secured with the front rigid body 205, and holds the optics block 165. The electronic display 155 emits image light toward the optics block 165. The optics block 165 magnifies the image light, and in some embodiments, also corrects for one or more additional optical errors (e.g., distortion, astigmatism, etc.). The optics block 165 directs the image light to the exit pupil 250 for presentation to the user. In some embodiments, the optics block 165 and the eye cup 255 may be omitted from the optical block 230.

The electronic display 155 emits image light for the optical block 230. As discussed in greater detail below, various regions of the electronic display 155 can be selectively controlled to display a variable resolution frame. Pixels of the electronic display 155 corresponding with a focus area of the eye 245 may operate at a native resolution where pixels are programmed (e.g., in a raster fashion for a frame) individually, while pixels outside of the focus area of the eye 245 may operate with a reduced resolution where multiple pixels are programmed as a group with a common pixel value.

Figure 4:
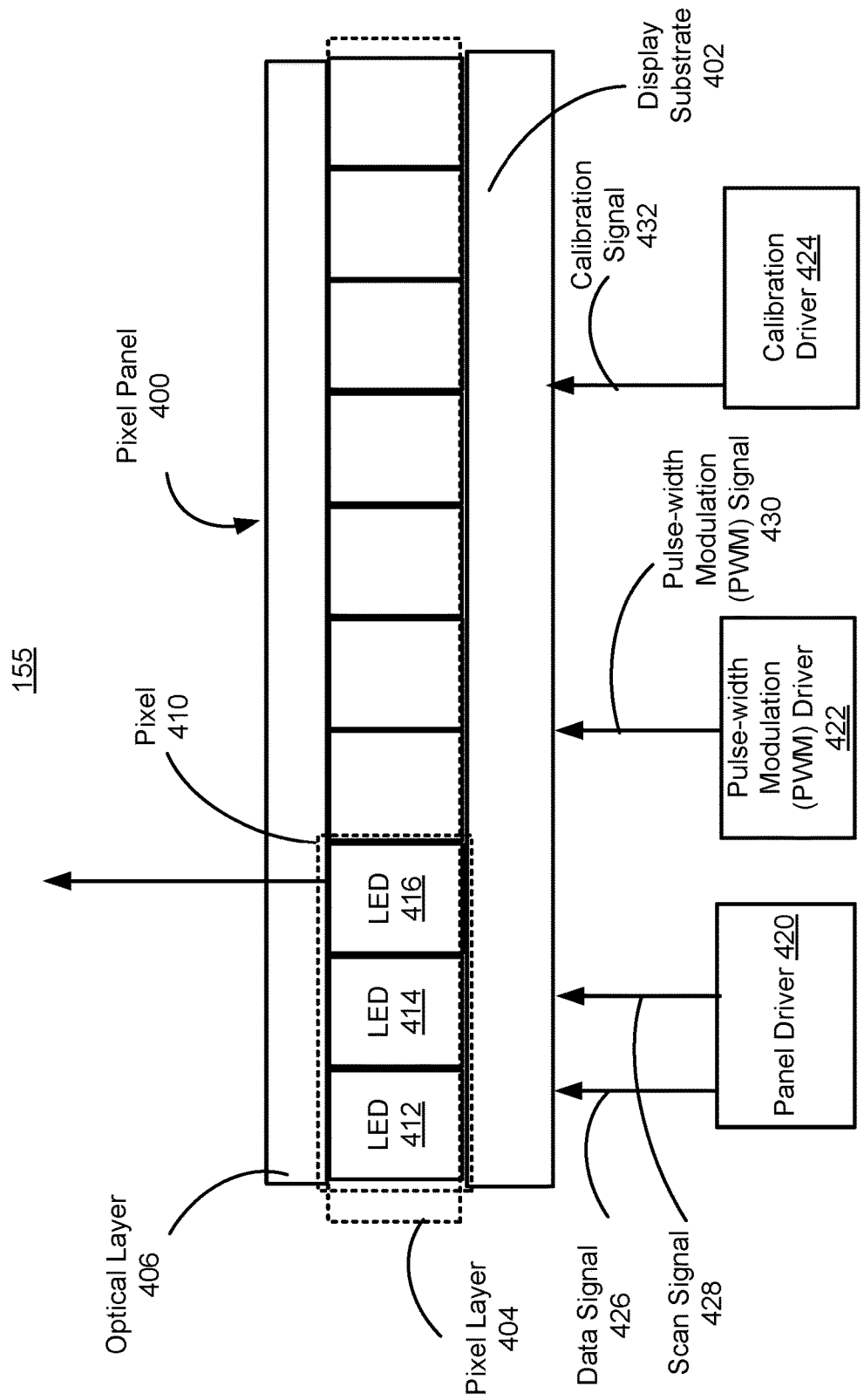
FIG. 4 is a block diagram illustrating an electronic display, in accordance with one embodiment.

FIG. 4 is a block diagram illustrating the electronic display 155 in the HMD 105, in accordance with one embodiment. The electronic display 155 has a multi-row active matrix architecture that delivers pulse-width modulation (PWM), data loading, and calibration independently to each other. Among other things, the electronic display 155 has high flexibility to optimize the PWM, data loading, and calibration.

The electronic display 155 has a display panel 400 including a display substrate 402 (or "substrate 402"), a pixel layer 404, and an optical layer 406. The pixel layer 404 includes an array of pixels 410 that are positioned on the display substrate 402. The pixels 410 of the pixel layer 404 emit light to provide image frames to the viewer. The display substrate 402 provides structural support for various components such as the pixels 410. The display substrate 402 further provides electrical connections via trace lines between the sub-pixel of the pixels 410 and a panel driver 420, a pulse-width modulation (PWM) driver 422, and a calibration driver 424. The display substrate 402 may be flexible substrate such as polymer or a rigid substrate such as a Thin Film Transistor (TFT) glass substrate, and includes the active matrix architecture. As discussed in greater detail in connection with FIG. 5, the panel driver 420 provides a data signal 426 to data lines of the electronic display 155 and a scan signal 428 to the scan lines of the display panel 400. The PWM driver 422 provides a PWM signal 430 to provide pulse width modulation to the driving current of the LEDs, and the calibration driver 424 provides a calibration signal 432 for adjusting gate voltage applied to each transistor of each LED.

The pixel layer 404 includes the sub-pixels that form the pixels 410. For example, a pixel 410 may include sub-pixels formed from LEDs 412, 414, and 416 respectively providing red, green, and blue color sub-pixels. Multiple sets of the LEDs 412, 414, and 416 are positioned on the display substrate 402 adjacent to each other to form a matrix of pixels 410. Each LED of each pixel 410 may emit different color light.

In some embodiments, the LEDs of each pixel 410 are each formed from a "μLED," or "Micro-LED," which is a particular type of LED having a small active light emitting area (e.g., less than 2,000 μm$^2$), and collimated light output. The LEDs of the pixel layer 404 may be fabricated separately and then bonded to the display substrate 402. For example, micro-LEDs may be fabricated on a native substrate, singulated, and then transferred to the display substrate 402 to form the pixel layer 404. The micro-LEDs may be positioned on the surface of the display substrate 402, and then bonded to form electrical connections with the lines of display substrate 402 (e.g., including a TFT layer). The calibration discussed herein can be applied to micro-LEDs because their small size and assembly processes can increase the occurrence of defects, such as mura. In other embodiments, the pixel correction is applied to other types of electronic displays, including those with other types of structures such as organic light emitting diode (OLED), liquid crystal display (LCD), or inorganic light emitting diode (ILED).

The optical layer 406 may be disposed on top of the pixel layer 404. The optical layer 406 may include one or more optical elements that transmit the light emitted from the pixels 410. The optical layer 406 may include brightness enhancement films (BEFs), diffusers, polarizers, etc. The optical layer 406 can change characteristics of the light passed through the optical layer 406, such as polarization orientation, efficiency of light extraction from the display panel, etc. The optical layer 406 may also provide structural protection for the components of the pixel layer 404. In some embodiments, the optical layer 406 is omitted from the electronic display 155.

Figure 5:
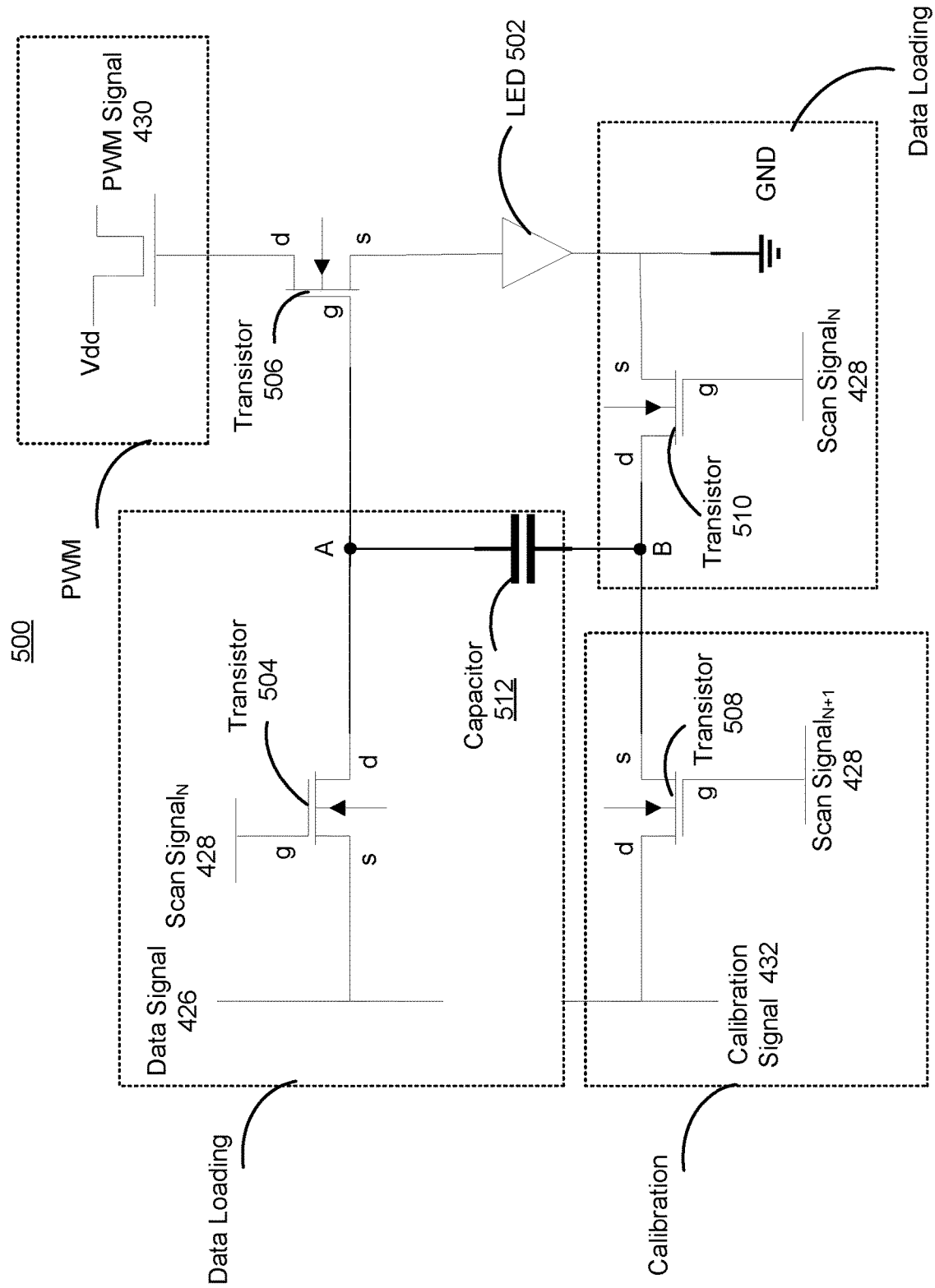
FIG. 5 is a schematic diagram of a control circuit for a sub-pixel of an electronic display, in accordance with one embodiment.

FIG. 5 is a schematic diagram of a control circuit 500 for a sub-pixel, in accordance with one embodiment. The electronic display 155 may include a control circuit 500 for each sub-pixel of the display panel 400 to control the LED 502 of the sub-pixel. The control circuit 500 provides the multi-row active matrix architecture that delivers pulse-width modulation (PWM), data loading, and calibration. The control circuit 500 includes a transistor 504, a transistor 506, a transistor 508, and transistor 510, a capacitor 512, and the LED 502.

The transistor 506 is a driving transistor for the LED 502. A first terminal of the LED 502 is connected to a reference voltage (GND) and a second terminal of the LED 502 is connected to the source of the transistor 506. The drain of the transistor 506 is connected to the PWM driver 420 to receive the PWM signal 430. The gate of the transistor 506 is connected at a node A with a first terminal of the capacitor 512 and the drain of the transistor 504. The source of the transistor 504 is connected to the panel driver 420 to receive the data signal 426, and the gate of the transistor 504 is connected to the panel driver 420 to receive the scan signal$_N$ 428. The scan signal$_N$ refers to the scan signal applied to the sub-pixel of the control circuit 500.

The first terminal of the LED 502 is further connected to the source of the transistor 508. The gate of the transistor 508 is connected to the panel driver 420 to receive the scan signal$_N$ 428. The drain of the transistor 508 is connected to a node B with a second terminal of the capacitor 512 and the source of the transistor 506. The gate of the transistor 506 is connected to the panel driver 420 to receive the scan signal$_{N+1}$ 428. The scan signal$_{N+1}$ refers to the scan signal of an adjacent scan line for an adjacent sub-pixel of the electronic display 155, such as the next scan line that is addressed by the panel driver 420 in a raster fashion. The drain of the transistor 506 is connected to the calibration signal 432.

As discussed in greater detail below in connection with FIG. 6, the transistor 504, capacitor 512, transistor 508, data signal 426, and scan signal$_N$ 428 are used in providing data loading to the LED 502. The PWM signal 430 is used in providing a pulse-width modulated signal for the transistor 506 to drive the LED 502. The calibration signal 432, scan signal$_{N+1}$ 428, and transistor 506 are used in providing calibration to adjust the gate voltage applied to the transistor 506. In some embodiments, the calibration driver 424 is a memory storing a calibration value (or "Vcal") for each control circuit 500. The Vcal for different LEDs 502 or sub-pixel of the electronic display 155 can be different, and may be determined in a post-manufacturing calibration and stored in the calibration driver 424.

The transistors of the control circuit 500, as well as the other control circuits discussed herein, may include thin-film transistors (TFTs). In another example, the transistors may be implemented with silicon processes. The transistors may include n-type transistors, p-type transistors, or combinations of n-type and p-type transistors.

FIG. 6 is a flow chart of a process 600 for controlling a sub-pixel of the electronic display 155, in accordance with one embodiment. The process 600 can be performed to provide pulse-width modulation (PWM), data loading, and calibration to a LED 502 of the sub-pixel.

The PWM driver 422 sets 605 the PWM signal 430 for the control circuit 500 to a low level to ensure that the transistor 506 remains off during programming of the sub-pixel. The sub-pixel is programmed in process 600 as discussed below with the PWM signal 430 set to the low level and the transistor 506 turned off. The transistor 506 is the driving transistor for the LED 502, and thus the LED 502 is also turned off and does not emit light during the programming of the sub-pixel.

The panel driver 420 sets 610 the scan signal$_N$ 428 to a high level for the gates of the transistors 504 and 510 of the control circuit 500, and sets the data signal 426 Vdata for the source of the transistor 504, causing the transistors 504 and 510 to turn on and the capacitor 512 to charge up to Vdata. The capacitor 512 of the sub-pixel is programmed with Vdata, and the process 600 proceeds to calibration.

Figure 7A:
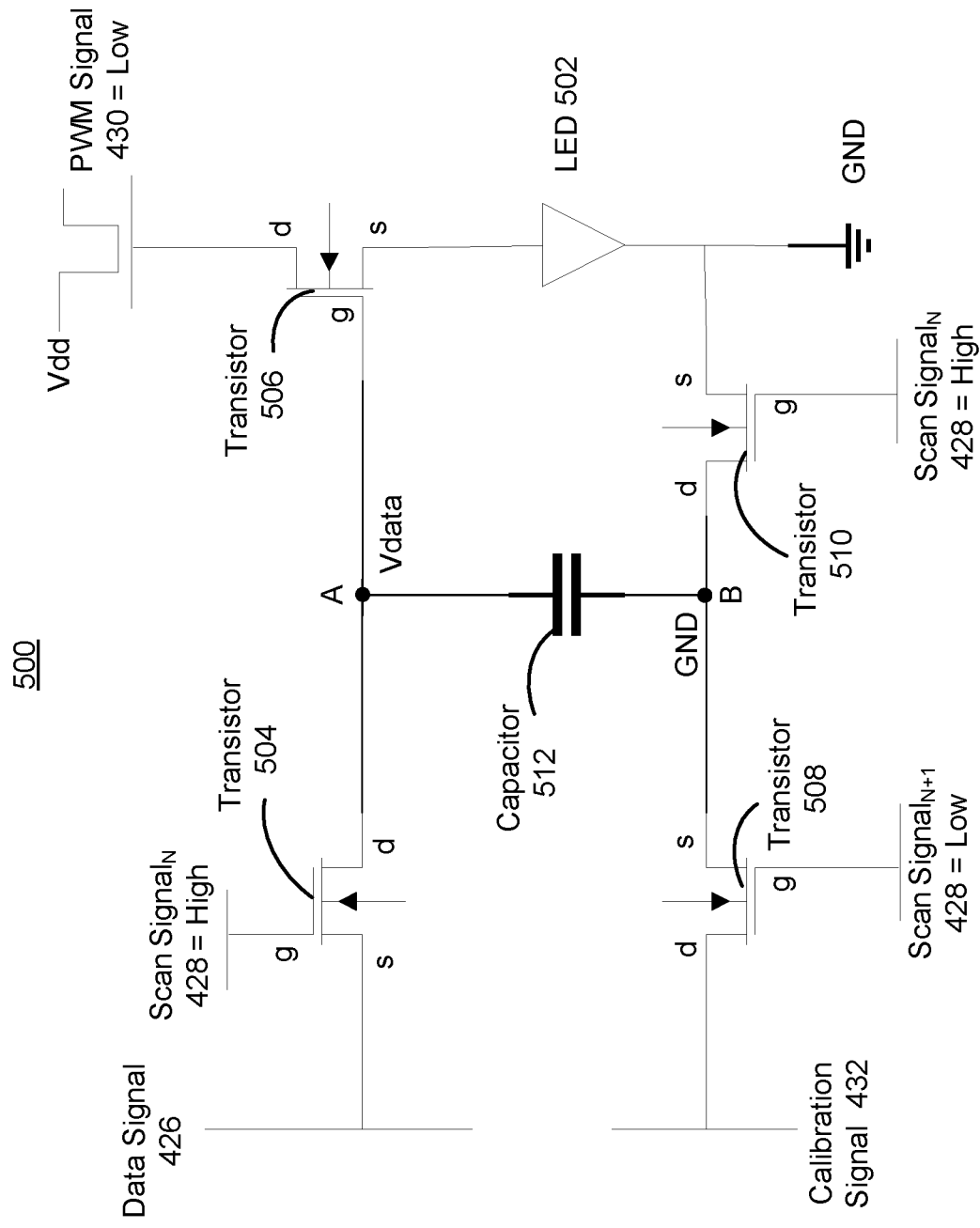
FIG. 7A is a schematic diagram of the control circuit after data loading and prior to calibration, in accordance with one embodiment.

FIG. 7A is a schematic diagram of the control circuit 500 after data loading and prior to calibration, in accordance with one embodiment. The scan signal$_N$ 428 is set to high levels for the gates of the transistors 504 and 508. The PWM signal 430 and the scan signal$_{N+1}$ are set to low levels. The node A has the voltage Vdata, and the node B is connected to a reference voltage (GND). Because the transistor 506 is turned off, the calibration signal 432 can be set to Vcal or some other value without affecting the data loading functionality of the control circuit 500.

Returning to FIG. 6, the panel driver 420 sets 615 the scan signal$_N$ 428 to a low level for the gate of the transistor 508, resulting in the capacitor 512 being turned into a floating capacitor. In particular, the node B is disconnected from the reference voltage, and the voltage Vdata is stored across the terminals of the capacitor 512 between node A and node B. The gate of the transistor 504 may also bet set to a low level by the scan signal$_N$ 428.

The panel driver 420 sets 620 the scan signal$_{N+1}$ 428 to a high level for the gate of the transistor 506. This results in transistor 506 turning on. For example, the programming with Vdata is complete for the control circuit 500 of the N scan line, and the panel driver 420 sets the scan signal$_N$ 428 to the low level and the scan signal$_{N+1}$ to the high level to provide data loading to a control circuit for the N+1 scan line, and simultaneously to provide calibration for the control circuit 500.

The calibration driver 424 sets 625 the calibration signal 432 to Vcal for the drain of the transistor 506 to apply Vcal to the node B, resulting in the node A being increased to Vdata+Vcal. In particular, the node B has the voltage Vcal relative to the reference voltage and the capacitor 512 stores the voltage Vdata, and thus node A has voltage Vdata+Vcal relative to the reference voltage. The node A is the high potential node of the floating capacitor 512 and the Node B is the low potential node of the floating capacitor 512. Furthermore, the voltage of Node A is provided to the gate of the driving transistor 506. Subsequent to data loading and calibration, and the process 600 proceeds to driving the LED with the PWM signal 430 if Vdata+Vcal exceeds the threshold gate voltage of the transistor 506.

The PWM driver 422 sets 630 the PWM signal 430 to a high level, resulting in the LED 502 emitting according to the PWM signal 430 if the transistor 506 is turned on. For example, the PWM signal 430 is set to the high level voltage Vdd to cause a current to flow through the transistor 506 and the LED 502. If Vdata+Vcal satisfies the threshold gate voltage of the transistor 506 and the PWM signal 430 is Vdd, then the transistor 506 is turned on. If Vdata+Vcal fails to satisfy the threshold gate voltage of the transistor 506, such as when Vdata is at a low level, then the transistor 506 is turned off (e.g., regardless of the level of the PWM signal 430).

The process 600 can be repeated for sub-pixel in each scan cycle of the electronic display. Furthermore, each sub-pixel of the electronic display can be controlled in a scan cycle using the process 600.

Figure 7B:
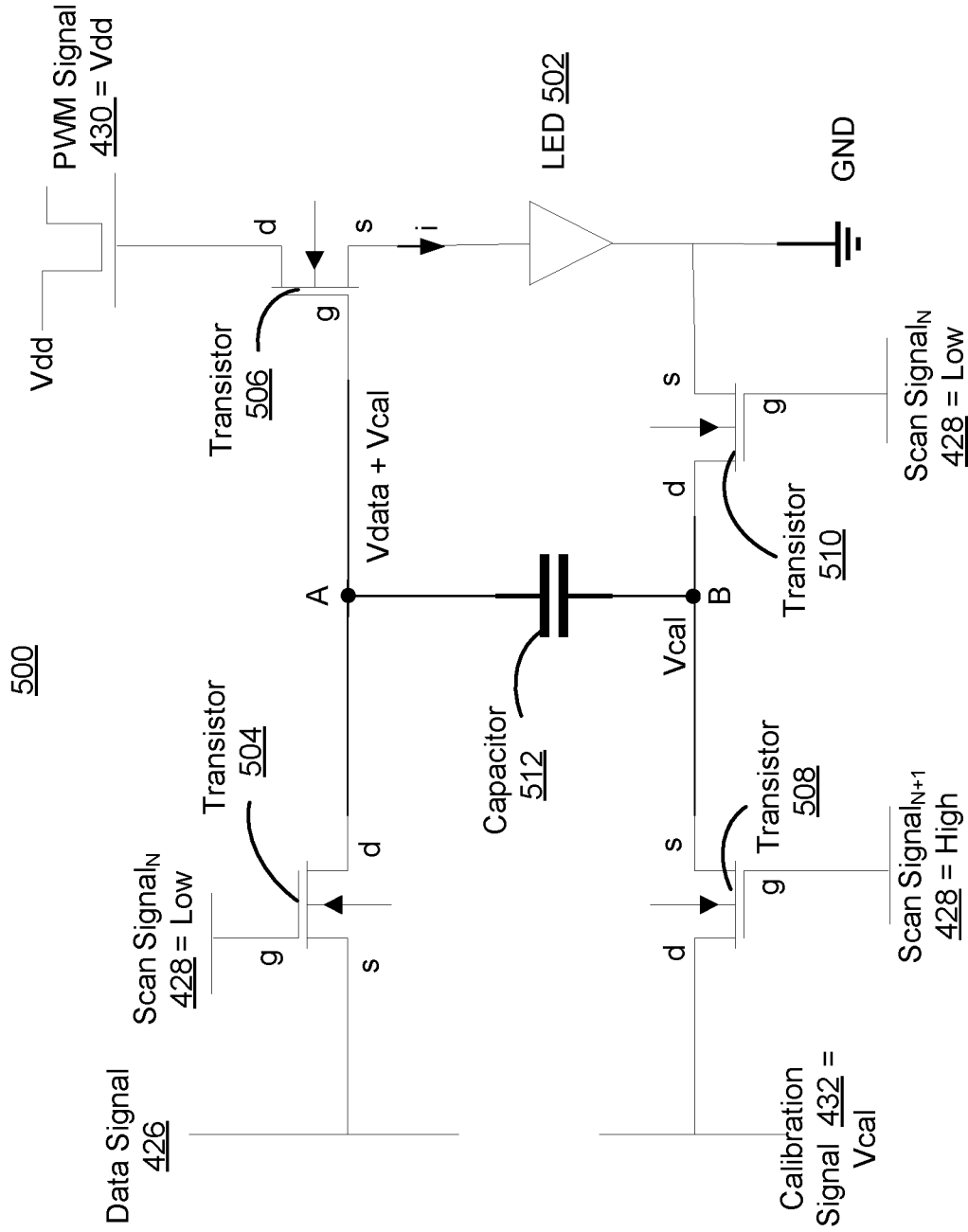
FIG. 7B is a schematic diagram of the control circuit after calibration, in accordance with one embodiment.

FIG. 7B is a schematic diagram of the control circuit 500 after calibration, in accordance with one embodiment. The scan signal$_N$ 428 is set to low levels for the gates of the transistors 504 and 508. The PWM signal 430 is set to the high level Vdd. The scan signal$_{N+1}$ is set to the high level to turn of the transistor 506. The node A has the voltage Vdata+Vcal, and the node B has the voltage Vcal. If Vdata+Vcal satisfies the threshold gate voltage of the transistor 506 and the PWN signal 430 is Vdd, then a driving current I flows through the transistor 506 and the LED 502 to cause the LED 502 to emit light. The duty cycle or other properties of the PWM signal 430 may be set to control the brightness level of the LED 502.

Figure 8:
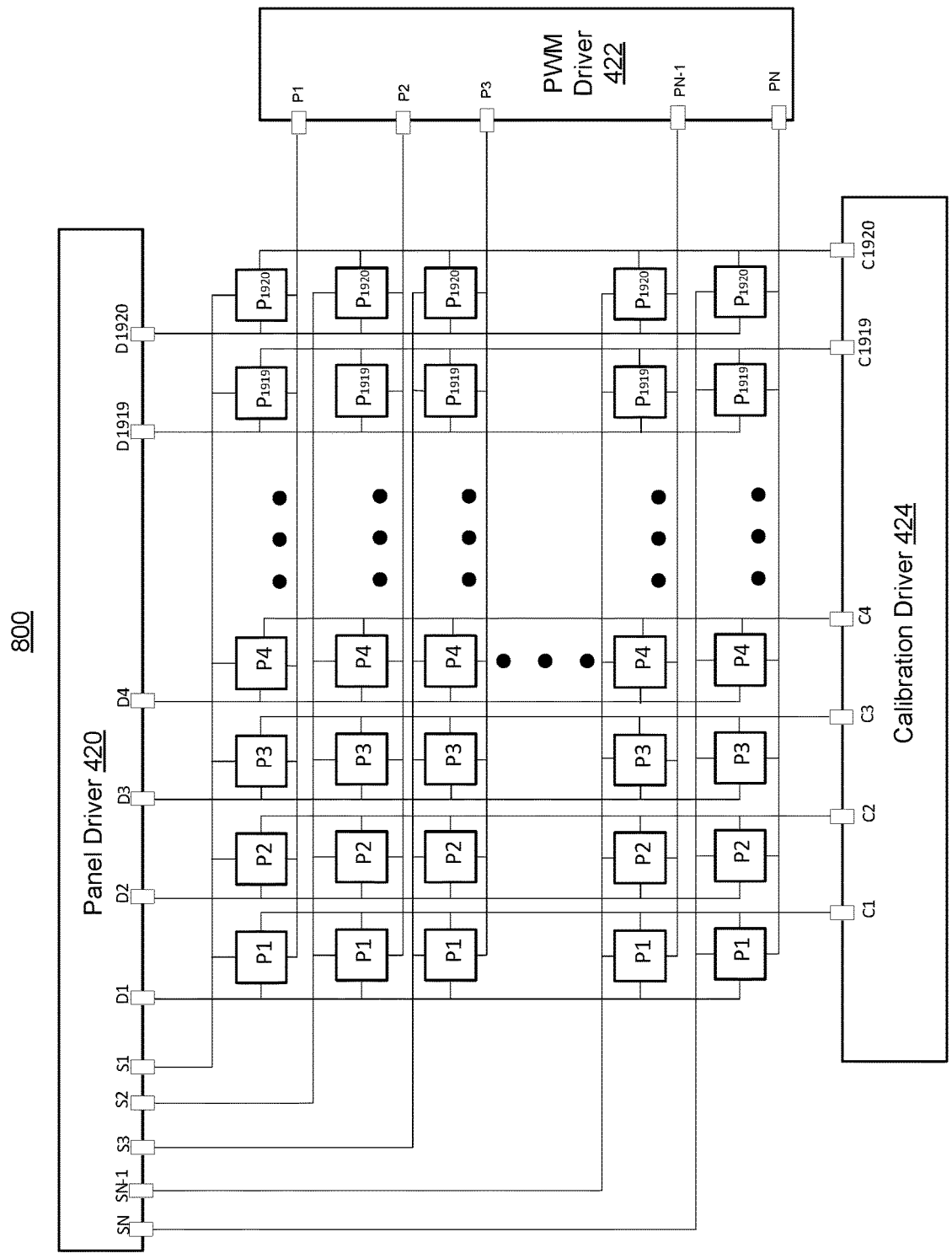
FIG. 8 is a block diagram of a control system for the electronic display, in accordance with one embodiment.

FIG. 8 is a block diagram of a control system 800 for the electronic display 155, in accordance with one embodiment. The electronic display 155 includes an array of pixels, such as 1920 columns×N rows of pixels. The pixel resolution, such as the column size, of the electronic display may vary. For example, rather than having 1920 columns of pixels, the electronic display may include M columns where M is an integer value.

Each pixel includes multiple sub-pixels, such as a red color sub-pixel including a red color LED, a blue color sub-pixel including a blue color LED, and a green color sub-pixel including a green color LED. Each of the sub-pixel types may be controlled by a control system 800. For example, the control system 800 may include 1920 columns of sub-pixels×N rows of sub-pixels. The rows of sub-pixels are controlled by the scan lines S1 through SN connected to the panel driver 420. Each row of pixels includes pixels P1 through P1920. The panel driver 420 provides the scan signals 428 to the rows of sub-pixels via the scan lines S1 through SN. Although not shown in FIG. 8, the panel driver 420 further provides the scan signal$_{N+1}$ 428 to each scan line N as discussed above in connection with FIGS. 5, 6, 7A and 7B. The panel driver 420 provides the data signals 426 to columns of sub-pixels via the data lines D1 through D1920. The PWM driver 422 provides the PWM signals 430 to rows of sub-pixels via the PWM lines P1 through PN. PWM driver 422 may be global for all color channels and sub-pixels so one PWM line from the PWM driver can be provided to each of the sub-pixels of a pixel.

The calibration driver 424 provides the calibration signal 432 to columns of the sub-pixels via the calibration lines C1 through C1920. The calibration driver may be a memory having a size defined by number of pixels×4 bits per pixel. The Vcal values stored in the memory can be programmed after an optical inspection. If real-time calibration is used to set Vcal, then the memory is multiple time programmable (MTP). If calibration is performed only once, then the memory can be one time programmable (OTP).

Multi-Layer Fabrication of Electronic Display

Figure 9:
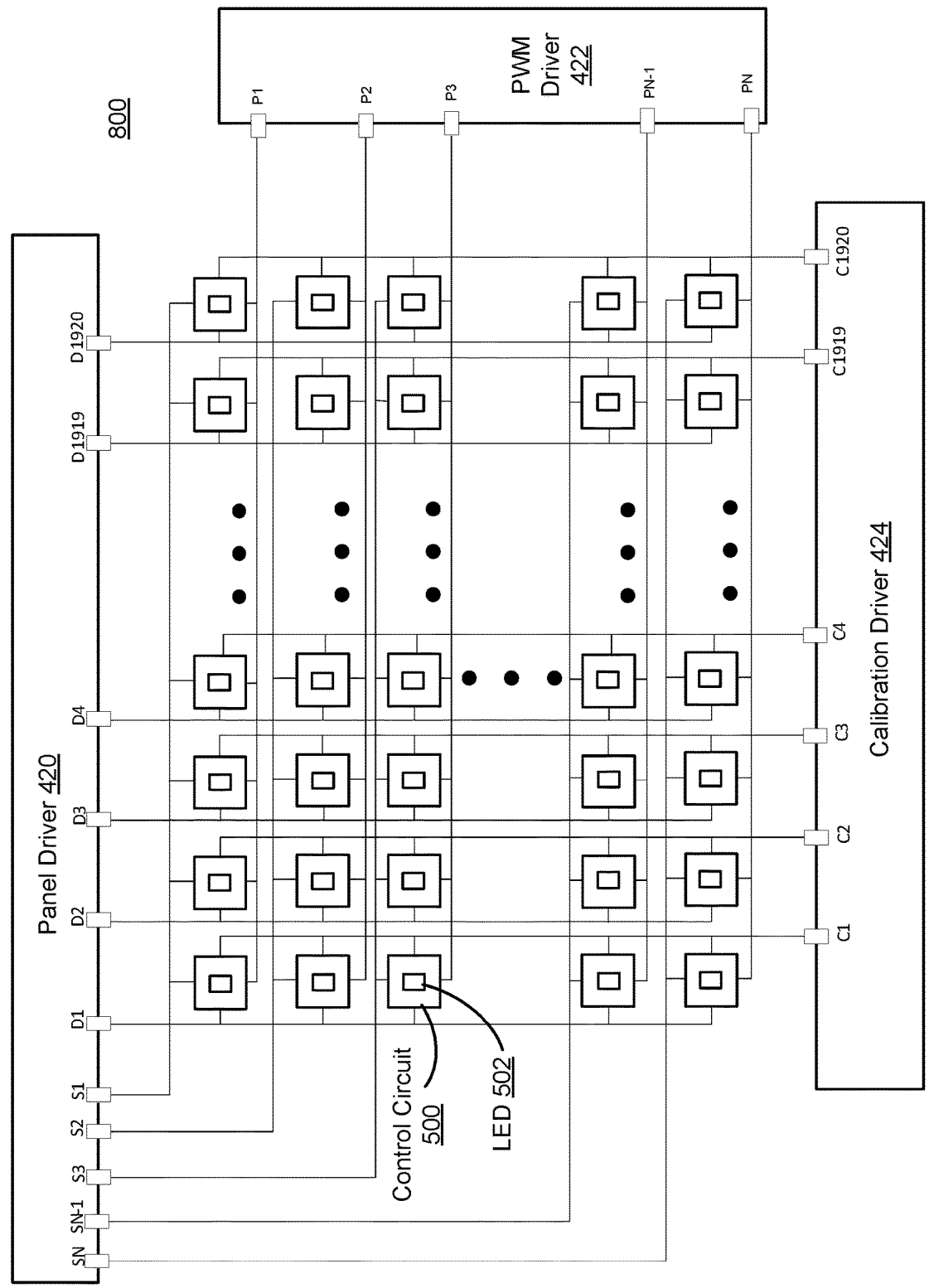
FIG. 9 is a block diagram of the control system for the electronic display, in accordance with one embodiment.

The electronic display 155 can include a multi-layer structure that includes the drivers, control circuits for LEDs, and the LEDs formed on separate layers and stacked on top of each other. The multi-layer structure reduces form factor for the electronic display 155 and improves performance of the electrical interconnections between components. FIG. 9 is a block diagram of the control system 800 for the electronic display, in accordance with one embodiment. In FIG. 9, each sub-pixel has an LED 502 and a control circuit 500. The control circuits 500 are analog components that provide voltages and currents that drive the LEDs 502. The panel driver 420, PWM driver 422, and calibration driver 424 are digital components that provide digital voltage levels to the control circuits 500. In some embodiments, the LEDs 502, analog components including control circuits 500, and digital components including the drivers 420, 422, and 424 are located in different layers of a multi-layer structure of the electronic display 155.

Figure 10:
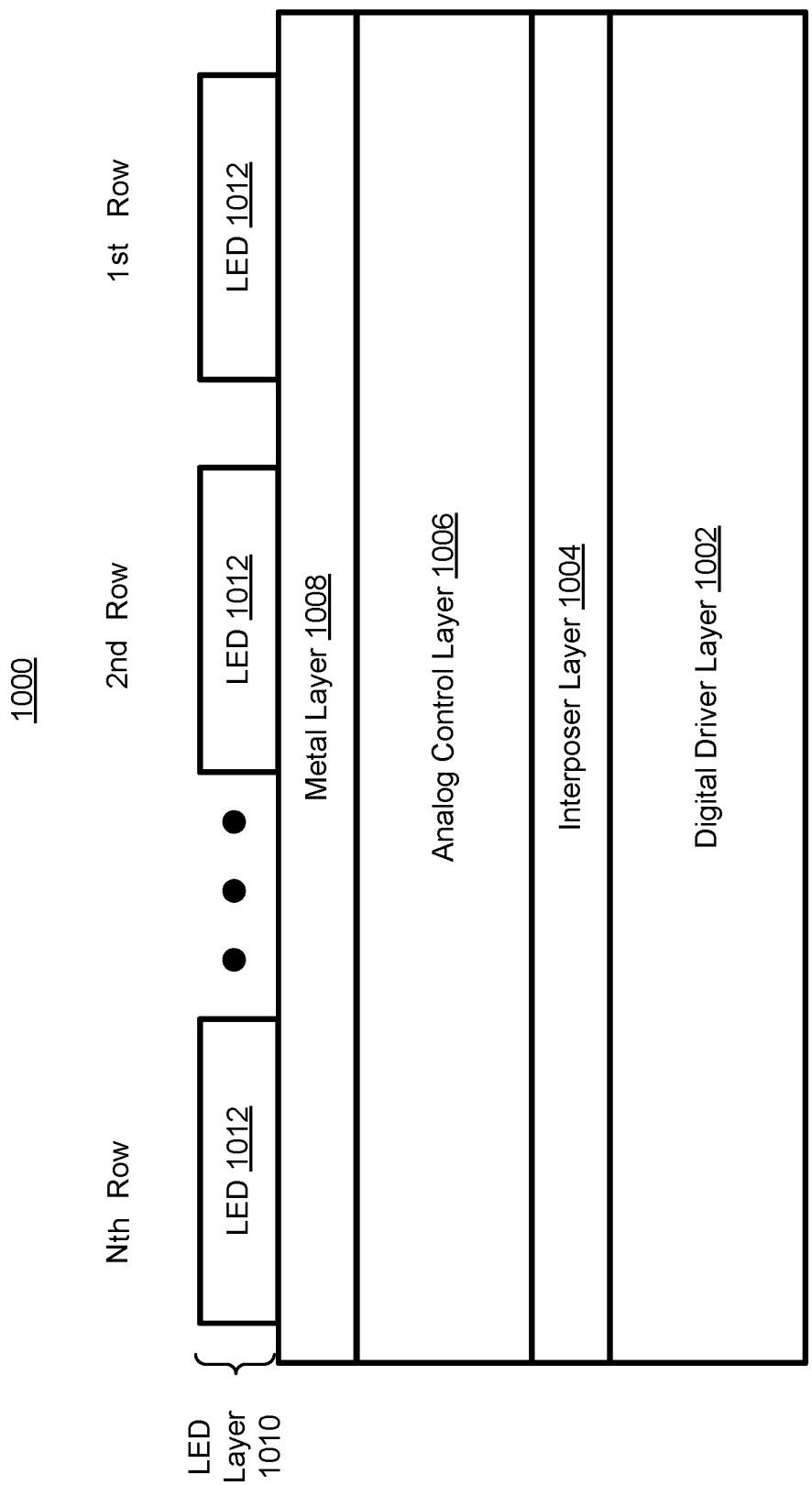
FIG. 10 is a schematic diagram of a side view of a multi-layer structure of an electronic display, in accordance with one embodiment.

FIG. 10 is a schematic diagram of a side view a multi-layer structure 1000 of an electronic display, in accordance with one embodiment. The multi-layer structure 1000 includes a digital driver layer 1002 (also referred to as "driver layer"), an interposer layer 1004, an analog control layer 1006 (also referred to as "control layer"), a metal layer 1008, and an LED layer 1010. The interposer layer 1004 is positioned on the digital driver layer 1002, the analog control layer 1006 is positioned on the interposer layer 1004, the metal layer 1008 is positioned on the analog control layer 1008, and the LED layer 1010 including LEDs 1012 for rows 1 through N is positioned on the metal layer 1008. Each of the rows 1 through N can include multiple LEDs as shown in FIG. 9, and thus an array of LEDs (e.g., forming pixels) are defined in the LED layer 1010.

The digital driver layer 1002 includes one or more drivers that provide control signals to the analog control layer 1006. For example, the digital driver layer 1002 may include the drivers of the electronic display 155, such as the panel driver 420, the PWM driver 422, and the calibration driver 424. The type of drivers integrated with the digital driver layer 1002 may vary. For example, the PWM driver 422 may be replaced with a non-pulsed driver. In another example, the calibration driver 424 may be omitted if calibration is not used.

The digital driver layer 1002 may use high frequency signals for data loading and processing, and digital voltage levels to control the operation of the analog control layer 1006. In some embodiments, the digital driver layer 1002 is fabricated separately from the other layers of the multi-layer structure. In some embodiments, the digital driver layer 1002 has a minimum feature size of 45 nanometers or smaller, such as by being fabricated using a 45 nanometer or smaller fabrication node. In some embodiments, the digital driver layer 1002 can have a receiver of greater than 10 GBps and the operation frequency of the circuits integrated in the digital driver layer can be greater than 500 MHz. When the digital driver layer includes only digital blocks, the voltage may be set to 1.1V or less.

The interposer layer 1004 is a high density, passive layer providing electrical interconnections between the digital driver layer 1002 and the analog control layer 1006. The interposer layer 1004 provides interconnections between the drivers of the digital driver layer 1002 and the control circuits of the analog control layer 1006 to transmit the control signals from the digital driver layer 1002 to the analog control layer 1006. In some embodiments, the digital driver layer 1002 and the analog control layer 1006 are fabricated separately, and then joined and electrically interconnected by the interposer layer 1004. In some embodiments, the interposer layer 1004 includes M (e.g., M=1920 in FIG. 9) columns×N rows of interconnections for the M columns×N rows of pixels of the electronic display 155.

The analog control layer 1006 defines control circuits 500 for each of the LEDs 1012 in the LED layer 1010. The analog control layer 1006 provides driving currents to the LEDs 1012 in the LED layer 110 according to the control signals from the digital driver layer 1002. For example, the transistors 504, 506, 508, and 510, the lines for the data signal 426, calibration signal 432, and PWM signal 430, and the capacitor 512 of the control circuit 500 for each sub-pixel may be located in the analog control layer 1006. The frequency of the analog control layer 1006 may be defined by the PWM signal 430 and the N number of rows of pixels. In some embodiments, the frequency of the analog control layer 1006 is lower than the frequency of the digital driver layer 1002. If the LEDs 1012 are micro-LEDs, then the voltage of the analog control layer 1006 may be in the order 3 to 5 volts, which is referred to herein as a middle voltage (MV) level. In some embodiments, the analog control layer 1006 includes a minimum feature size of between 45 nanometers and 60 nanometers, such as may be fabricated using a 45 nanometer or 60 nanometer process node.

The metal layer 1008 provides electrical connections between the LED layer 1010 and the analog control layer 1006. The metal layer 1008 transmits the driving currents from the analog control layer 1006 to the LEDs 1012 of the LED layer 1010. The metal layer 1008 is an upper metallization layer that may be deposited on the analog control layer 1008 to form a micro-led micro-assembly with the LED layer 1010. In some embodiments, the metal layer 1008 is a silver (Au) layer, although other materials such as copper (Cu), gold (Au), or Copper-Silicon (Cu—Si) may also be used. The metal layer 1008 may include a fine pitch to support interconnections between the analog control layer 1008 and the LEDs 1012 when the LEDs 1012 are micro-LEDs.

Different layers of the multi-layer structure 1000 may be fabricated separately, and in some embodiments using different processes, and are then stacked to achieve a desirable form factor. In this way, each layer can be optimized to combined best performance with best form factor. In one example, the digital driver layer 1002, analog control layer 1006, and LEDs 1012 of the LED layer 1010 are fabricated separately. The digital driver layer 1002 and the analog control layer 1006 are joined by the interposer layer 1004. The LEDs 1012 are joined to the analog control layer 1006 with the metal layer 1008. In some embodiments, the LED layer 1010 and the metal layer 1008 are fabricated in the same process with the analog control layer 1006.

Figure 11:
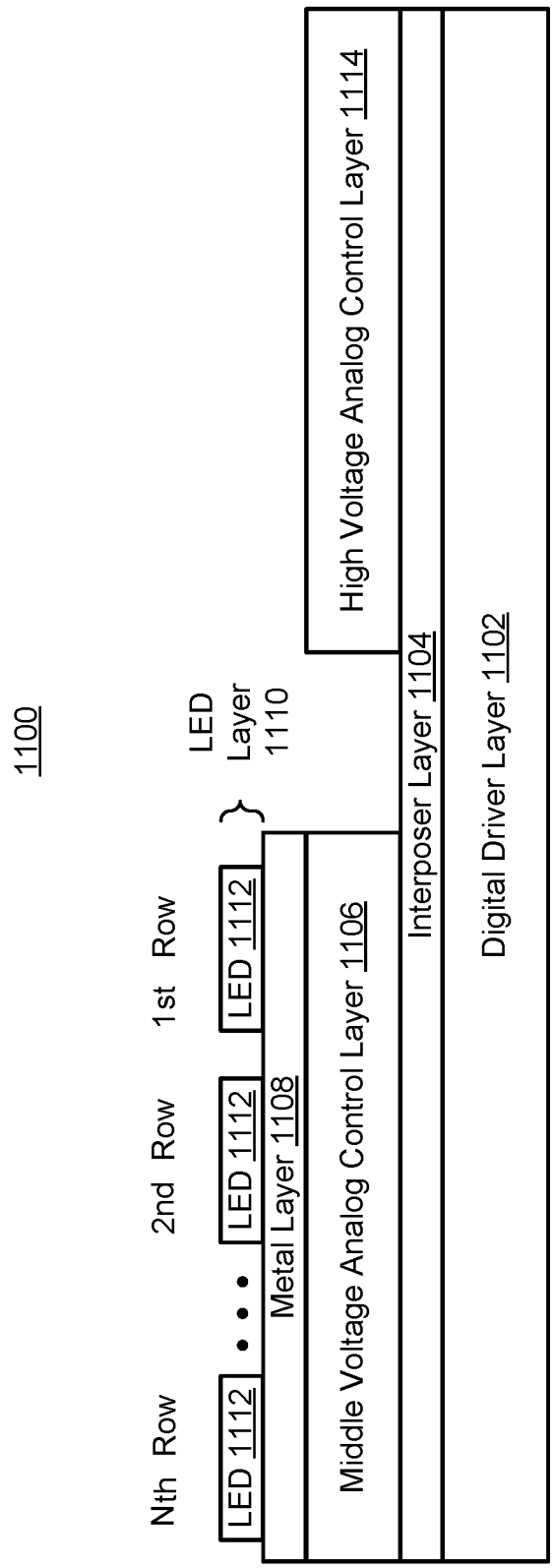
FIG. 11 is a schematic diagram of a side view of a multi-layer structure of an electronic display, in accordance with one embodiment.

FIG. 11 is a schematic diagram of a side view a multi-layer structure 1100 of an electronic display, in accordance with one embodiment. The multi-layer structure 1100 includes a digital driver layer 1102, an interposer layer 1104, a middle voltage (MV) analog control layer 1006, a metal layer 1108, an LED layer 1110 including LEDs 1112, and a high voltage (HV) analog control layer 1114. The discussion of corresponding components in the multi-layer structure 1000 may be applicable to the multi-layer structure 1100. The multi-layer structure 1100 further includes the HV analog control layer 1114 positioned on the interposer layer 1104. The interposer layer 1104 provides electrical interconnections between the drivers of the digital driver layer 1102 and the HV analog control layer 1114, as well as the drivers of the digital driver layer 1102 and the MV analog control layer 1106.

The HV analog control layer 1114 may drive components of the electronic display at a higher voltage level than the MV analog control layer 1106. The HV analog control layer 1114 may drives components other than the LEDs 1112. For example, the HV analog control layer 1114 may drive a micro-electro-mechanical system (MEMS) mirror that reflects light emitted from the LEDs of the LED layer, or some other component. The HV analog control layer 1114 may control the component according to a control signal from the digital driver layer 1102 transmitted via the interposer layer 1104.

In some embodiments, the HV analog control layer 1114 is fabricated in a different process from the digital driver layer 1102 and the MV analog control layer 1106, and then joined to the multi-layer structure via the interposer layer 1104.

Figure 12:
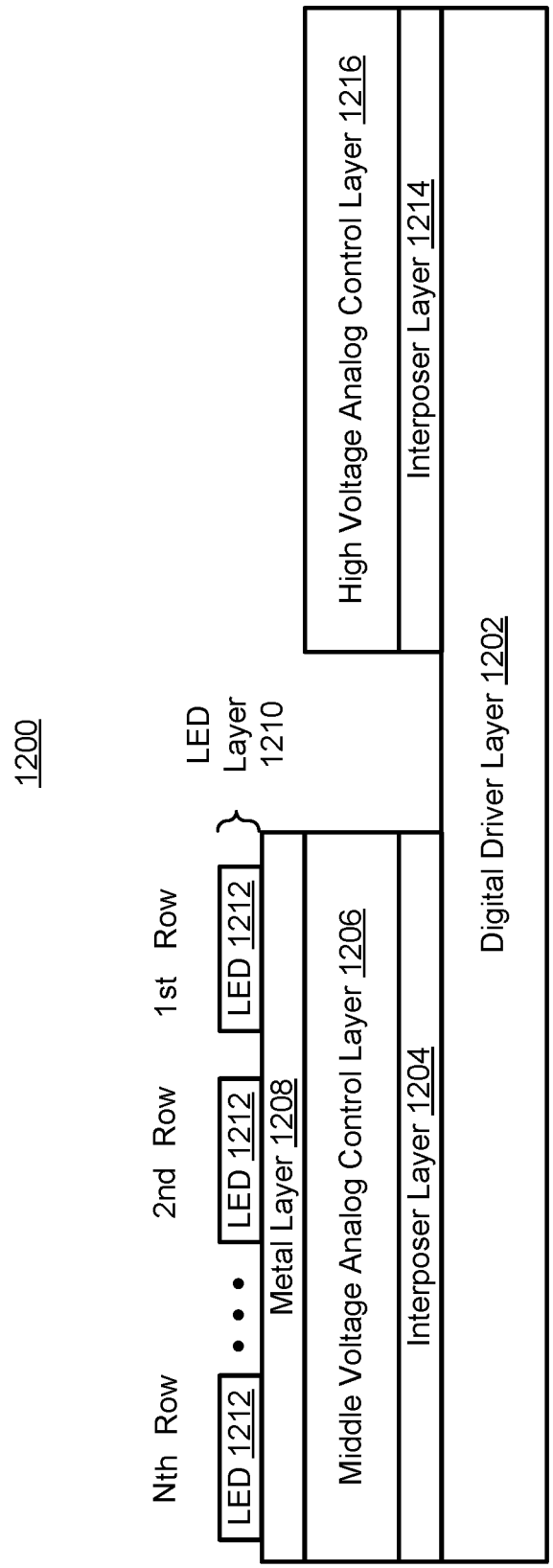
FIG. 12 is a schematic diagram of a side view of a multi-layer structure of an electronic display, in accordance with one embodiment.

FIG. 12 is a schematic diagram of a side view a multi-layer structure 1200 of an electronic display, in accordance with one embodiment. The multi-layer structure 1200 includes a digital driver layer 1202, an interposer layer 1204 connecting the digital driver layer 1202 to a MV analog control layer 1206. A metal layer 1208 is positioned on the MV analog control layer, and a LED layer 1210 including LEDs 1212 are positioned on the metal layer 1208. The multi-layer structure further includes a HV analog control layer 1216. The discussion of corresponding components in the multi-layer structure 1100 may be applicable to the multi-layer structure 1200. The multi-layer structure 1200 differs from the multi-layer structure 1100 in that a separate interposer layer 1214 is positioned between and provides electrical interconnections between the HV analog control layer 1216 and the digital driver layer 1202. In particular, the interposer layer 1214 is separate from the interposer layer 1204 that connects the digital driver layer 1202 to the MV analog control layer 1206.

In some embodiments, the HV analog control layer 1216 is fabricated in a different process from the digital driver layer 1202 and the MV analog control layer 1206, and then joined is to the multi-layer structure 1200 via the interposer layer 1104.

Figure 13:
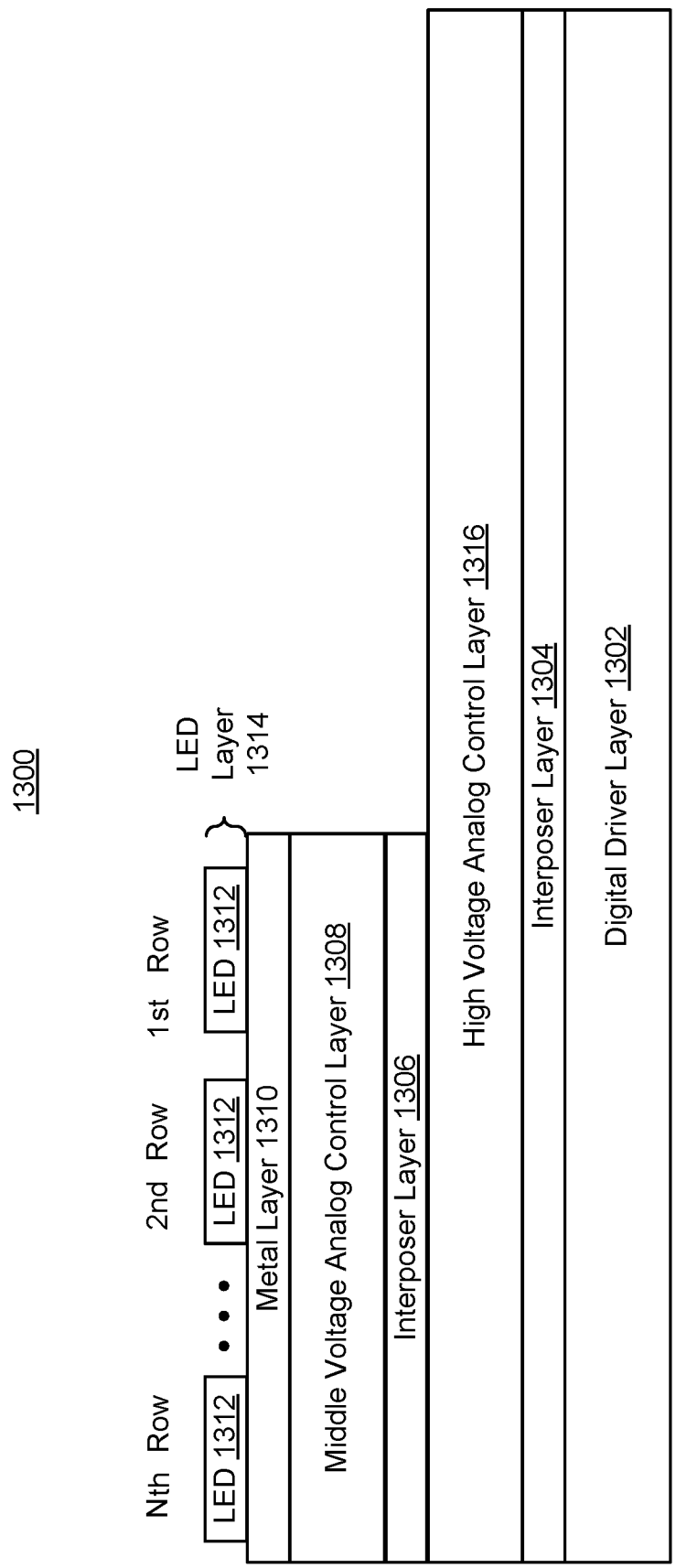
FIG. 13 is a schematic diagram of a side view of a multi-layer structure of an electronic display, in accordance with one embodiment.

FIG. 13 is a schematic diagram of a side view a multi-layer structure 1300 of an electronic display, in accordance with one embodiment. The multi-layer structure 1300 includes a digital driver layer 1302, an interposer layer 1304 connecting the digital driver layer 1302 to a HV analog control layer 1316. Another interposer layer 1306 is positioned on the HV analog control layer 1316, and electrically connects the HV analog control layer 1316 to a MV analog control layer 1308. A metal layer is positioned over the MV analog control layer 1308 and provides electrical connections between the MV analog control layer 1308 and the LEDs 1312 of the LED layer 1314.

The discussion of corresponding components in the multi-layer structure 1200 may be applicable to the multi-layer structure 1300. The multi-layer structure 1300 differs from the multi-layer structure 1200 in that the MV analog control layer 1308 is stacked on the HV analog control layer 1306. Here, the signals from the digital driver layer 1302 for controlling the MV analog control layer 1308 are passed through the interposer layer 1304, the HV analog control layer 1316, and the interposer layer 1306.

In some embodiments, the HV analog control layer 1316, the digital driver layer 1302, and the MV analog control layer 1308 are fabricated in different processes. These separately fabricated layers are then joined and electrically connected by the interposer layers 1306 and 1304 to form the multi-layer structure 1300.

Figure 14:
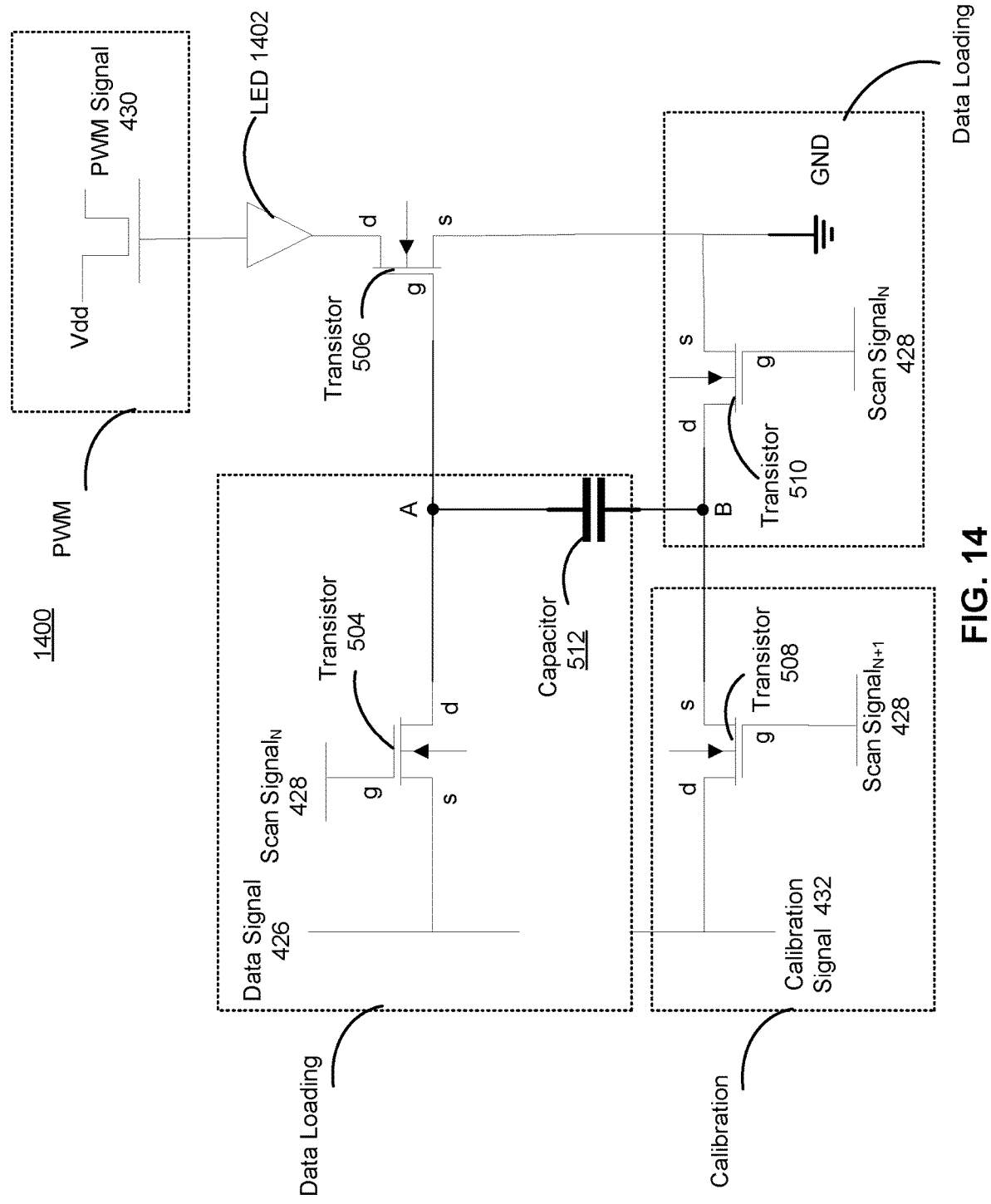
FIG. 14 is a schematic diagram of a control circuit for a sub-pixel of an electronic display, in accordance with one embodiment.

FIG. 14 is a schematic diagram of a control circuit 1400 for a sub-pixel of an electronic display, in accordance with one embodiment. The control circuit 1400 is similar to the control circuit 500, except that the LED 1402 is in a common anode topology. In the common anode topology, the LED 1402 is placed between the power supply Vdd and the drain of the driving transistor 506. In contrast, the LED 502 of the control circuit 500 is in a common cathode topology, with the LED 502 placed between the source of the driving transistor 506 and the reference voltage (GND).

Depending on whether the common cathode or common anode topography is used, the effective gate-to-source voltage (Vgs, eff) of the driving transistor 506 is different when Vdata is applied to the gate of the driving transistor 506. For the common cathode, the Vgs, eff of the driving transistor 506 is equal to Vdata−$V_{LED}$, where $V_{LED}$ is the voltage across the LED 502. For the common anode, the Vgs,eff of the driving transistor 506 is equal to Vdata. As such, for the same Vgs, eff (and same driving current for the LED), Vdata has to be higher for the common cathode topology compared to the common anode topology. Therefore, the common anode topology may be used to provide lower dynamic data power compared to the common cathode topology.

Figure 15:
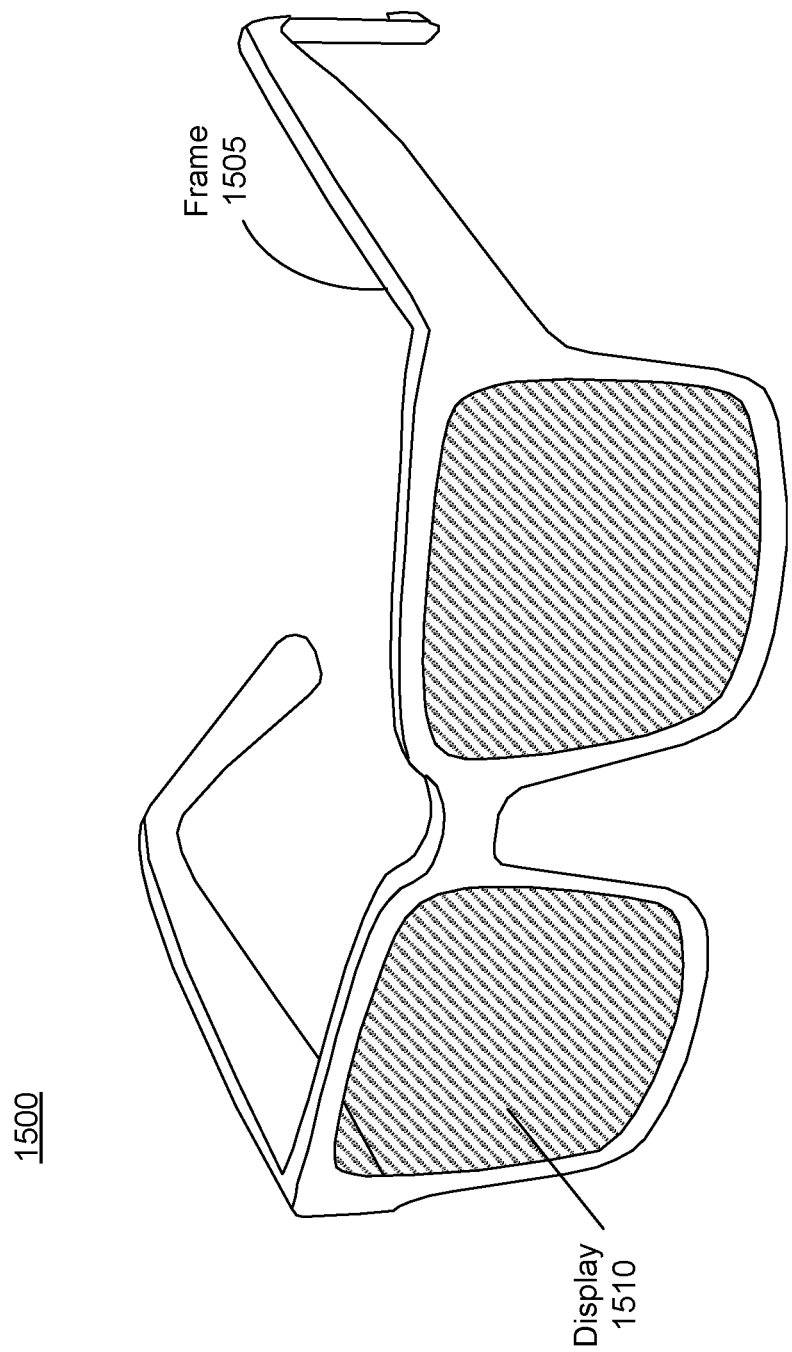
FIG. 15 is a schematic diagram of a near-eye display (NED), in accordance with one embodiment.

FIG. 15 is a schematic diagram of a near-eye-display (NED) 1500, in accordance with an embodiment. The NED 1500 presents media to a user, and is an example of the HMD 105. Examples of media presented by the NED 1500 include one or more images, video, audio, or some combination thereof. In some embodiments, audio is presented via an external device (e.g., speakers and/or headphones) that receives audio information from the NED 1500, a console (not shown), or both, and presents audio data based on the audio information. The NED 1500 is generally configured to operate as a VR NED. However, in some embodiments, the NED 1500 may be modified to also operate as an augmented reality (AR) NED, a mixed reality (MR) NED, or some combination thereof. For example, in some embodiments, the NED 1500 may augment views of a physical, real-world environment with computer-generated elements (e.g., images, video, sound, etc.).

The NED 1500 shown in FIG. 15 includes a frame 1505 and a display 1510. The frame 1505 is coupled to one or more optical elements which together display media to users. In some embodiments, the frame 1505 may represent a frame of eye-wear glasses. The display 1510 is configured for users to see the content presented by the NED 1500. The display 1510 is an example of an electronic display 155 including a multi-layer structure. As discussed below in conjunction with FIG. 16, the display 1510 includes at least one waveguide display assembly (not shown) for directing one or more image light to an eye of the user. The waveguide display assembly includes, e.g., a waveguide display, a stacked waveguide display, a varifocal waveguide display, or some combination thereof. The stacked waveguide display is a polychromatic display created by stacking waveguide displays whose respective monochromatic sources are of different colors.

Figure 16:
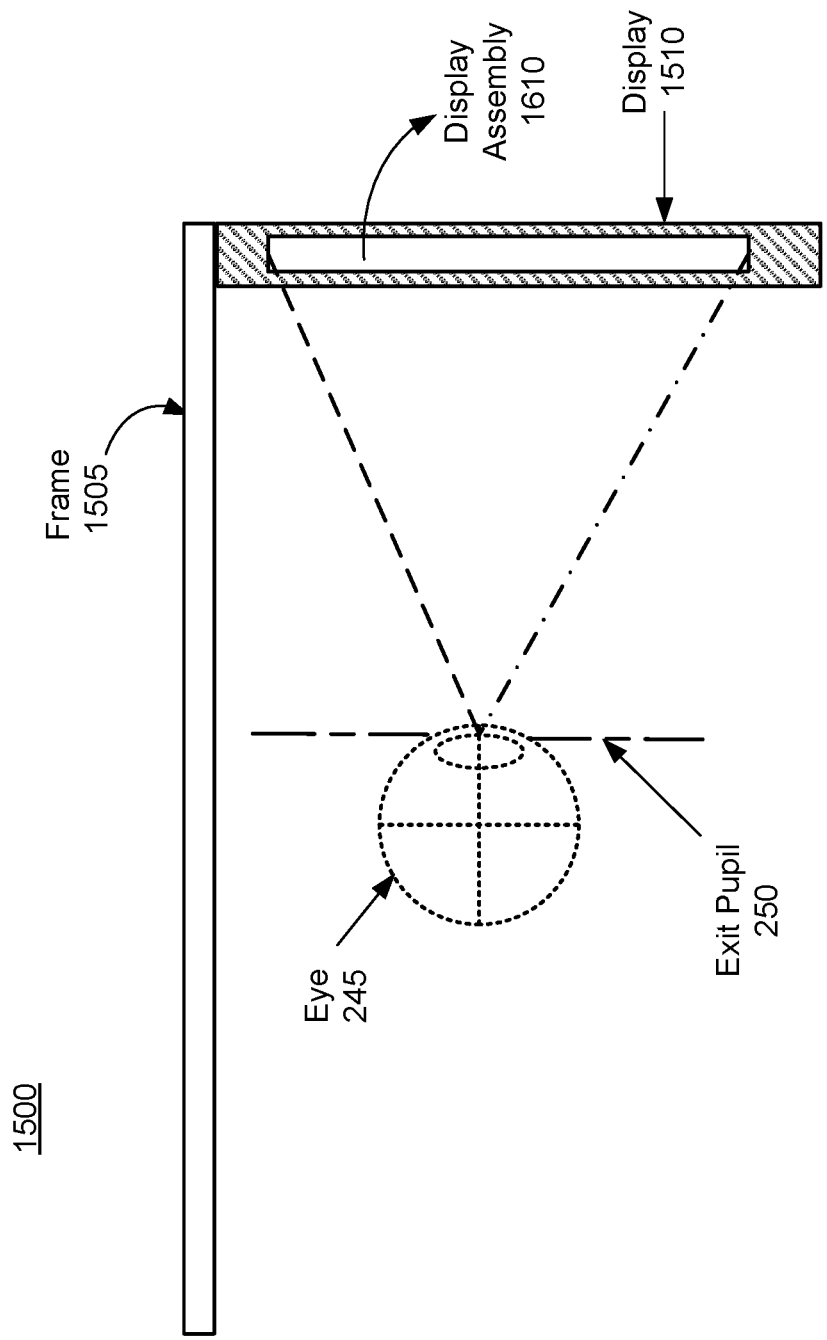
FIG. 16 is a cross-section of the NED illustrated in FIG. 15, in accordance with an embodiment.

FIG. 16 is a cross-section of the NED 1500 illustrated in FIG. 15, in accordance with an embodiment. The display 1510 includes at least one display assembly 1610. An exit pupil 250 is a location where the eye 245 is positioned when the user wears the NED 1500. For purposes of illustration, FIG. 16 shows the cross section associated with a single eye 245 and a single display assembly 1610, but in alternative embodiments not shown, another waveguide display assembly which is separate from the waveguide display assembly 1610 shown in FIG. 16, provides image light to another eye 245 of the user.

The display assembly 1610, as illustrated below in FIG. 16, is configured to direct the image light to the eye 245 through the exit pupil 250. The display assembly 1610 may be composed of one or more materials (e.g., plastic, glass, etc.) with one or more refractive indices that effectively minimize the weight and widen a field of view (hereinafter abbreviated as 'FOV') of the NED 1500. In alternate configurations, the NED 1500 includes one or more optical elements between the display assembly 1510 and the eye 245. The optical elements may act to, e.g., correct aberrations in image light emitted from the display assembly 1610, magnify image light emitted from the display assembly 1610, some other optical adjustment of image light emitted from the display assembly 1610, or some combination thereof. The example for optical elements may include an aperture, a Fresnel lens, a convex lens, a concave lens, a filter, or any other suitable optical element that affects image light.

In some embodiments, the display assembly 1610 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors.

Figure 17:
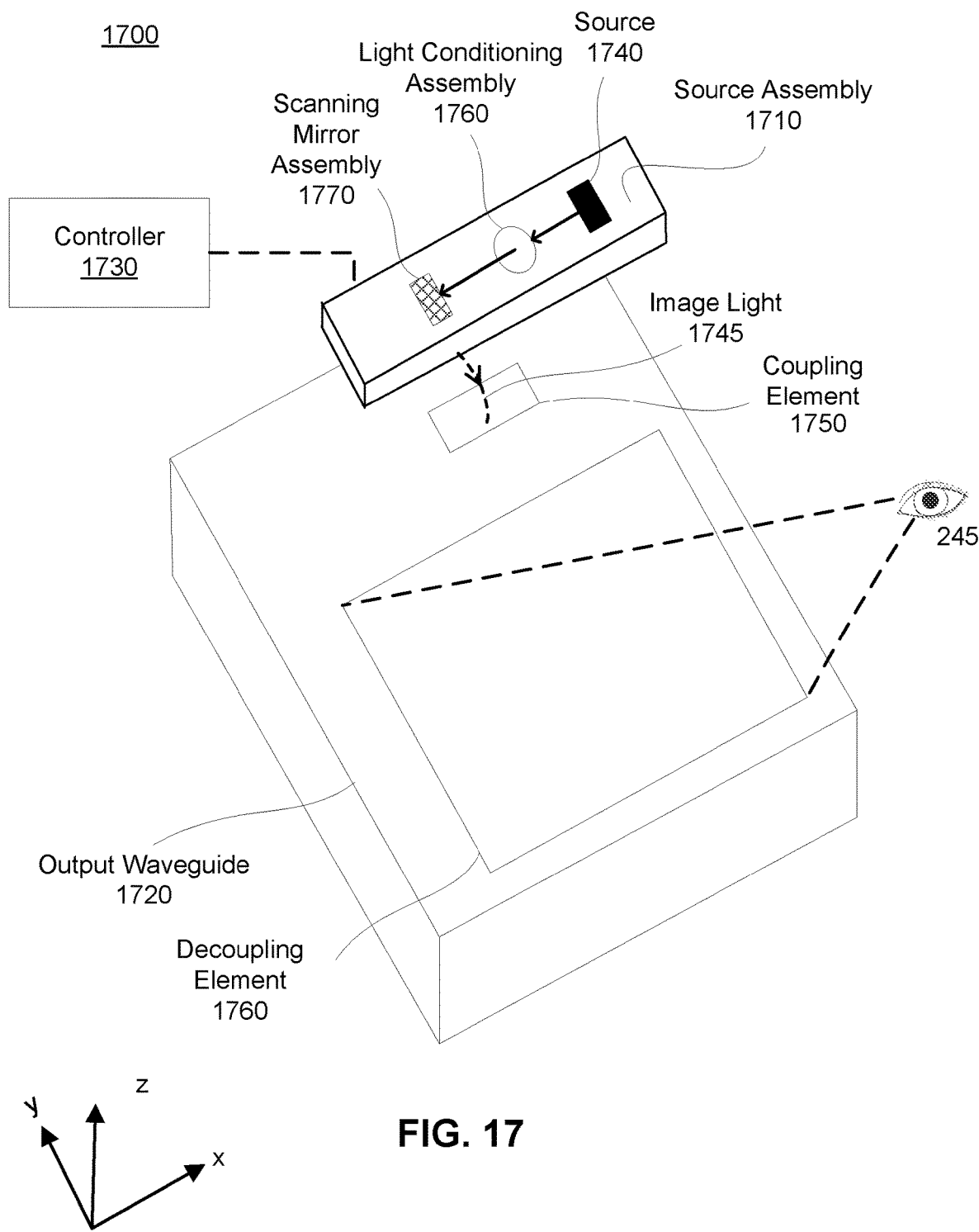
FIG. 17 is an isometric view of a waveguide display, in accordance with an embodiment.

FIG. 17 illustrates an isometric view of a waveguide display 1700, in accordance with an embodiment. In some embodiments, the waveguide display 1700 (may also be referred to as a scanning waveguide display) is a component (e.g., display assembly 1610) of the NED 1500. In alternate embodiments, the waveguide display 1700 is part of some other NED, or other system that directs display image light to a particular location.

The waveguide display 1700 includes a source assembly 1710, an output waveguide 1720, and a controller 1730. For purposes of illustration, FIG. 17 shows the waveguide display 1700 associated with a single eye 245, but in some embodiments, another waveguide display separate (or partially separate) from the waveguide display 1700, provides image light to another eye of the user. In a partially separate system, one or more components may be shared between waveguide displays for each eye.

The source assembly 1710 generates image light. The source assembly 1710 includes a source 1740, a light conditioning assembly 1760, and a scanning mirror assembly 1770, described in detail below with reference to FIG. 18. The source assembly 1710 generates and outputs image light 1745 to a coupling element 1750 of the output waveguide 1720.

The source 1740 is a source of light that generates at least a coherent or partially coherent image light. The source 1740 emits light in accordance with one or more illumination parameters received from the controller 1730. The source 1740 includes one or more source elements, including, but not restricted to MicroLEDs.

The output waveguide 1720 is an optical waveguide that outputs image light to an eye 245 of a user. The output waveguide 1720 receives the image light 1740 at one or more coupling elements 1750, and guides the received input image light to one or more decoupling elements 1760. In some embodiments, the coupling element 1750 couples the image light 1740 from the source assembly 1710 into the output waveguide 1720. The coupling element 1750 may be, e.g., a diffraction grating, a holographic grating, some other element that couples the image light 1740 into the output waveguide 1720, or some combination thereof. For example, in embodiments where the coupling element 1750 is diffraction grating, the pitch of the diffraction grating is chosen such that total internal reflection occurs, and the image light 1740 propagates internally toward the decoupling element 1760. For example, the pitch of the diffraction grating may be in the range of 300 nm to 600 nm.

The decoupling element 1760 decouples the total internally reflected image light from the output waveguide 1720. The decoupling element 1760 may be, e.g., a diffraction grating, a holographic grating, some other element that decouples image light out of the output waveguide 1720, or some combination thereof. For example, in embodiments where the decoupling element 1760 is a diffraction grating, the pitch of the diffraction grating is chosen to cause incident image light to exit the output waveguide 1720. An orientation and position of the image light exiting from the output waveguide 1720 is controlled by changing an orientation and position of the image light 1740 entering the coupling element 1750. For example, the pitch of the diffraction grating may be in the range of 300 nm to 600 nm.

The output waveguide 1720 may be composed of one or more materials that facilitate total internal reflection of the image light 1740. The output waveguide 1720 may be composed of e.g., silicon, plastic, glass, or polymers, or some combination thereof. The output waveguide 1720 has a relatively small form factor for a head-mounted display. For example, the output waveguide 1720 may be approximately 50 mm wide along X-dimension, 30 mm long along Y-dimension and 0.5-1 mm thick along Z-dimension. In some embodiments, the output waveguide 320 is a 2D optical waveguide.

The controller 1730 controls the scanning operations of the source assembly 1710. The controller 1730 determines scanning instructions for the source assembly 1710 based at least on the one or more display instructions. Display instructions are instructions to render one or more images. In some embodiments, display instructions may simply be an image file (e.g., bitmap). The display instructions may be received from, e.g., a console of a VR system (not shown here). Scanning instructions are instructions used by the source assembly 1710 to generate image light 1740. The scanning instructions may include, e.g., a type of a source of image light (e.g. monochromatic, polychromatic), a scanning rate, an orientation of a scanning mirror assembly, one or more illumination parameters, or some combination thereof. The controller 1730 includes a combination of hardware, software, and/or firmware not shown here so as not to obscure other aspects of the disclosure.

Figure 18:
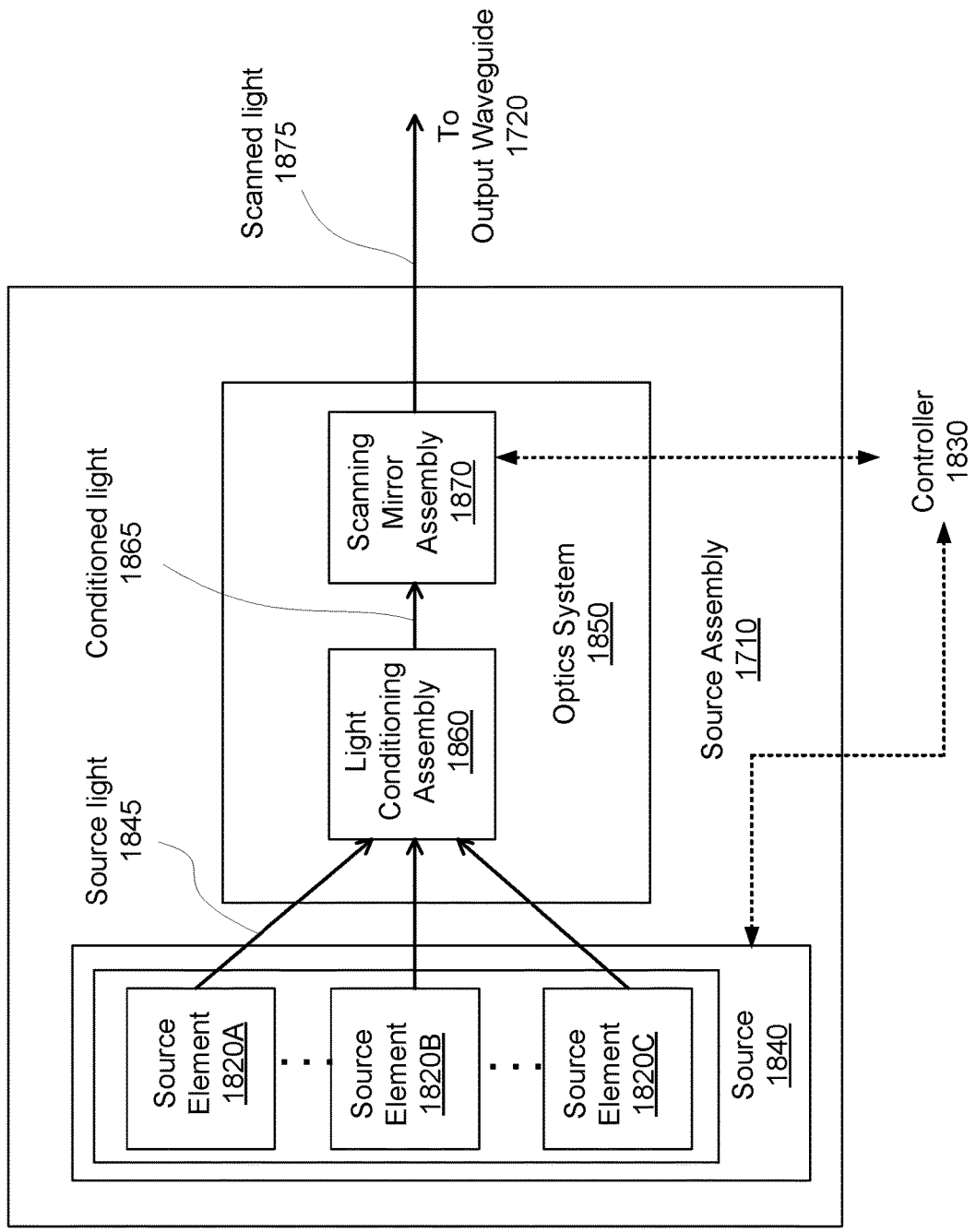
FIG. 18 is a block diagram of a source assembly with a 1D source, the source assembly outputting a scanned light, in accordance with an embodiment.

FIG. 18 is a block diagram of the source assembly 1710 of FIG. 17 with a 1D source, the source assembly 1710 outputting a scanned light, in accordance with an embodiment. The source assembly 1710 includes a source 1840, and an optics system 1850. The source 1840 is an embodiment of the source 1740 of FIG. 17. The optics system 1850 includes a light conditioning assembly 1860 and a scanning mirror assembly 1870. The light conditioning assembly 1860 is an embodiment of the light conditioning assembly 1760 of FIG. 17. The scanning mirror assembly 1870 is an embodiment of the scanning mirror assembly 1770 of FIG. 17. The source assembly 1710 generates light in accordance with scanning instructions from the controller 1730 of FIG. 17.

The source 1840 is a source of light that generates at least a coherent or partially coherent image light. The source 1840 emits light in accordance with one or more illumination parameters received from the controller 1730. The source 1840 includes one or more source elements 1820. The source element 1820 may be LEDs with at least ultra-high brightness, low power consumption, and a low footprint. The source element 1820 may be, e.g., MicroLEDs, organic LEDs (OLEDs), a superluminescent LED (SLED), and organic MicroLEDs. A MicroLED is a LED that can be made small such that light emission area can be made to the order of a micron to a few tens of microns. For example, GaN-based inorganic LEDs can be made orders of magnitude brighter than OLEDs with a light emission area of few microns. The source 1840 may be a 1D source, 2D source, or have some other dimension.

In one embodiment, the source element 1820 may be arranged in a concave curved and linear fashion. For example, the source 1840 may have a radius of curvature ranging from few millimeters to few centimeters depending on the display size and a length of few millimeters. An advantage of a curved array is that it is much easier for a compact lens to have high quality image on curved surface without correcting the field of curvature of the lens. In alternate embodiments, the source element 1820 may be arranged in a flat and linear fashion.

The source element 1820 emits a source light 1845 to the optics system 1850. In some embodiments, the source light 1845 may emit one or more colors (e.g. red, green, and blue). For example, the source element 1820A emits a red source light, the source element 1820B emits a blue source light, and the source element 1820C emits a green source light. Additionally, in some embodiments, one or more of the source elements may emit light in the infrared.

The optics system 1850 includes a light conditioning assembly 1860 and a scanning mirror assembly 1870. The light conditioning assembly 1860 conditions the source light 1845 and emits conditioned light to the scanning mirror assembly 1870. Conditioned light is light conditioned for incidence on the scanning mirror assembly 1870. The light conditioning assembly 1860 includes one or more optical components that condition the light from the source 1840. Conditioning light from the source 1840 may include, e.g., expanding, collimating, correcting for one or more optical errors (e.g., field curvature, chromatic aberration, etc.), some other adjustment of the light, or some combination thereof. The light conditioning assembly 1860 conditions the source light 1845 and emits conditioned light 1865 to the scanning mirror assembly 1870.

The scanning mirror assembly 1870 includes one or more optical elements that redirect image light via one or more reflective portions of the scanning mirror assembly 1870. Where the image light is redirected toward is based on specific orientations of the one or more reflective portions. In some embodiments, the scanning mirror assembly includes a single scanning mirror that is configured to scan in at least two dimensions. In other embodiments, the scanning mirror assembly 1870 may include a plurality of scanning mirrors that each scan in orthogonal directions to each other. The scanning mirror assembly 1870 may raster scan (horizontally, or vertically). In some embodiments, the scanning mirror assembly 1870 may perform a controlled vibration along the horizontal and/or vertical directions with a specific frequency of oscillation to scan along two dimensions and generate a two-dimensional projected line image of the media presented to user's eyes. For example, the scanning mirror assembly 1870 may undergo an oscillation with peak-to-peak amplitude of few hundreds of nanometers per second along the vertical direction based on the desired frequency of oscillation. The scanning mirror assembly 1870 emits a scanned light 1875 based on the conditioned light 1865. The scanning mirror assembly 1870 outputs the scanned light 1875 at a particular orientation (in accordance with the scanning instructions) toward the output waveguide 1720.

In some embodiments, the scanning mirror assembly 1870 includes a galvanometer mirror. For example, the galvanometer mirror may represent any electromechanical instrument that indicates that it has sensed an electric current by deflecting a beam of image light with one or more mirrors. The galvanometer mirror may be configured to scan in at least one orthogonal dimension to generate the scanned light 1875. The scanned light 1875 from the galvanometer mirror represents a two-dimensional line image of the media presented to user's eyes.

The controller 1730 controls the source 1840 and the scanning mirror assembly 1870. The controller 1730 takes content for display, and divides the content into discrete sections. The controller 1730 instructs the source 1840 to sequentially present the discrete sections. The controller 1730 instructs the scanning mirror assembly 1870 to scan the presented discrete sections to different areas of a coupling element of the output waveguide. Accordingly, at the exit pupil of the output waveguide 1720 each discrete portion is presented in a different location. While each discrete section is presented at different times, the presentation and scanning of the discrete sections occurs fast enough such that a user's eye integrates the different sections into a single image or series of images.

For example, in embodiments where the source 1840 includes a linear one-dimensional array of source elements 1820, the content is divided by the controller 1730 into lines where the lines are scanned out to different areas of the coupling element of the output waveguide 1720, such that, at the exit pupil of the output waveguide 1720 each of the lines are presented at a different location which a user's eye integrates into a single image or series of images.

In some embodiments, the display 1510 includes a multi-layer structure. For example, a middle voltage analog control layer (e.g., layer 1106, 1206, or 1308) instructs the source 1840 to sequentially present the discrete sections, while the high voltage analog control layer (e.g., layer 1114, 1216, or 1316) instructs the scanning mirror assembly 1870 to scan the presented discrete sections to different areas of a coupling element of the output waveguide 1720. Here, the scanning mirror assembly 1870 is an example of the MEMS mirror.

Figure 19:
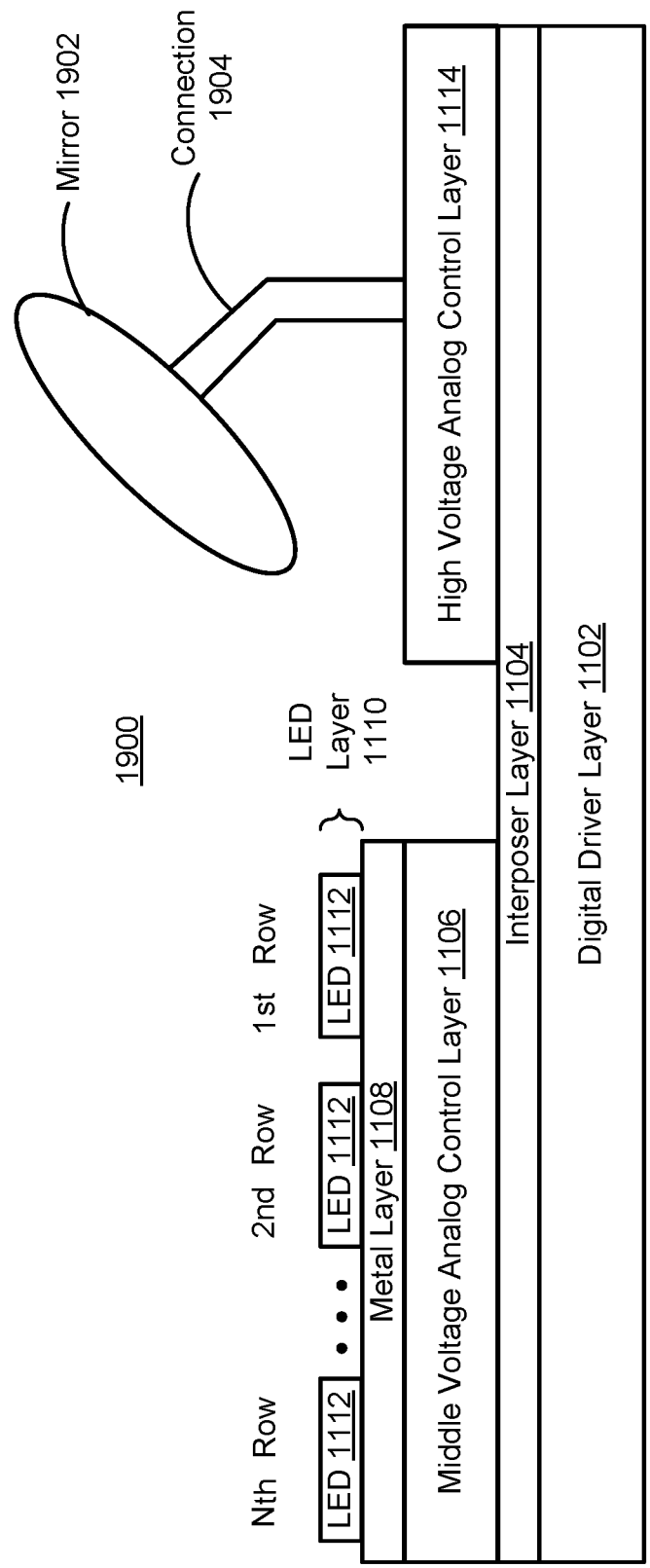
FIG. 19 is a schematic diagram of a side view of a multi-layer structure including a mirror, in accordance with one embodiment.

FIG. 19 is a schematic diagram of a side view of a multi-layer structure 1900 including a mirror 1902, in accordance with one embodiment. The multi-layer structure 1900 is like the multi-layer structure 1100 shown in FIG. 11, and includes a mirror 1902 coupled to the HV analog control layer 1114 via a connection 1904. In some embodiments, the mirror 1902 is integrated on the HV analog control layer 1114 instead of being coupled via the connection 1904.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure. The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon.

What is claimed is:

1. An electronic display, comprising:
    a driver layer including one or more drivers configured to provide control signals;
    a control layer including control circuits configured to drive light emitting diodes (LEDs) under control of the control signals from the driver layer;
    an interposer layer between the driver layer and the control layer, the interposer layer including electrical connections between the one or more drivers of the driver layer and the control circuits of the control layer to transmit the control signals from the driver layer to the control layer;

an LED layer including the LEDs, the control layer being configured to generate driving currents according to the control signals from the driver layer to drive the LEDs; and a metal layer between the control layer and the LED layer, the metal layer including electrical connections between the control circuits of the control layer and the LEDs of the LED layer to transmit the driving currents from the control layer to the LED layer.

2. The electronic display of claim 1, wherein the one or more drivers of the driver layer includes at least one of:
a panel driver configured to provide the control signals including data signals and scan signals to the control layer;
a pulse-width modulation (PWM) driver configured to provide the control signals including PWM signals to the control layer; or
a calibration driver configured to provide the control signals including calibration signals to the control layer.

3. The electronic display of claim 1, wherein:
the driver layer includes a first minimum feature size; and
the control layer includes a second minimum feature size larger than the first minimum feature size.

4. The electronic display of claim 1, wherein the driver layer operates at a first frequency and the control layer operates at a second frequency lower than the first frequency.

5. The electronic display of claim 1, wherein:
the control layer is configured to drive the LEDs with a first voltage level;
the electronic display further includes another control layer connected to the driver layer; and
the other control layer is configured to drive another component of the electronic display different from the LEDs with a second voltage level higher than the first voltage level.

6. The electronic display of claim 5, wherein the interposer layer is between the driver layer and the other control layer, the interposer layer including other electrical connections between the driver layer and the other control layer.

7. The electronic display of claim 5, further comprising another interposer layer is-between the driver layer and the other control layer, the other interposer layer including other electrical connections between the driver layer and the other control layer.

8. The electronic display of claim 5, wherein the other component includes a micro-electro-mechanical system (MEMS) mirror that reflects light emitted from the LEDs of the LED layer.

9. The electronic display of claim 1, further including:
another control layer between the interposer layer and the driver layer; and
another interposer layer between the driver layer and the other control layer, the other interposer layer including electrical connections between the driver layer and the other control layer, the driver layer configured to provide the control signals to the control layer through the other interposer layer, the other control layer, the interposer layer.

10. The electronic display of claim 9, wherein the other control layer operates at a higher voltage than the control layer and the driver layer operates at a lower voltage than the control layer.

11. The electronic display of claim 9, wherein:
the control layer is configured to drive the LEDs with a first voltage level; and
the other control layer is configured to drive another component of the electronic display different from the LEDs with a second voltage level higher than the first voltage level.

12. The electronic display of claim 11, wherein the other component is a micro-electro-mechanical system (MEMS) mirror that reflects light emitted from the LEDs.

13. A method for controlling an electronic display, comprising:
generating, by a driver layer including one or more drivers, control signals;
transmitting, by an interposer layer between the driver layer and a control layer, the control signals from the driver layer to the control layer;
driving, by the control layer, light emitting diodes (LEDs) of the electronic display under control of the control signals from the driver layer;
generating, by the control layer, driving currents according to the control signals from the driver layer to drive the LEDs; and
transmitting, by a metal layer between the control layer and an LED layer including the LEDs, the driving currents from the control layer to the LED layer.

14. The method of claim 13, wherein generating, by the driver layer including one or more drivers, the control signals includes at least one of:
generating, by a panel driver, the control signals including data signals and scan signals to the control layer;
generating, by a pulse-width modulation (PWM) driver, the control signals including PWM signals to the control layer; or
generating, by a calibration driver configured, the control signals including calibration signals to the control layer.

15. The method of claim 13, wherein:
the driver layer includes a first minimum feature size; and
the control layer includes a second minimum feature size larger than the first minimum feature size.

16. The method of claim 13, wherein the driver layer generates the control signals including a first frequency and the control layer drives the LEDs at a second frequency lower than the first frequency.

17. The method of claim 13, wherein:
driving, by the control layer, the LEDs according to the control signals from the driver layer includes driving the LEDs with a first voltage level; and
the method further includes driving, by another control layer connected to the driver layer, another component of the electronic display different from the LEDs with a second voltage level higher than the first voltage level, the other control layer being connected to the driver layer via one of:
the interposer layer between the driver layer and the control layer; or
another interposer layer between the driver layer and the other control layer.

18. The method of claim 17, wherein the other component includes a micro-electro-mechanical system (MEMS) mirror that reflects light emitted from the LEDs of the LED layer.

* * * * *

UNITED STATES PATENT AND TRADEMARK OFFICE
CERTIFICATE OF CORRECTION

| | |
|---|---|
| PATENT NO. | : 10,902,769 B2 |
| APPLICATION NO. | : 16/020815 |
| DATED | : January 26, 2021 |
| INVENTOR(S) | : Ilias Pappas |

It is certified that error appears in the above-identified patent and that said Letters Patent is hereby corrected as shown below:

In the Claims

In Column 21, in Claim 7, Line 46, delete "is-between" and insert -- between --, therefor.

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*